(12) United States Patent
Sakai et al.

(10) Patent No.: US 6,392,451 B1
(45) Date of Patent: May 21, 2002

(54) THRESHOLD VALUE OPERATION CIRCUIT, AND, AND GATE CIRCUIT, SELF HOLD CIRCUIT, START SIGNAL GENERATION CIRCUIT USING THRESHOLD VALUE OPERATION CIRCUIT

(75) Inventors: Masayoshi Sakai; Toshihito Shirai, both of Urawa (JP)

(73) Assignee: The Nippon Signal Co., Ltd., Tokyo (JP)

( * ) Notice: Subject to any disclaimer, the term of this patent is extended or adjusted under 35 U.S.C. 154(b) by 0 days.

(21) Appl. No.: 09/485,456

(22) PCT Filed: Jun. 10, 1999

(86) PCT No.: PCT/JP99/03115

§ 371 Date: May 1, 2000

§ 102(e) Date: May 1, 2000

(87) PCT Pub. No.: WO99/65145

PCT Pub. Date: Dec. 16, 1999

(30) Foreign Application Priority Data

Jun. 10, 1998 (JP) ............................................. 10-162079
Feb. 26, 1999 (JP) ............................................. 11-051800

(51) Int. Cl.⁷ ............................................. H03K 5/153
(52) U.S. Cl. ........................................ 327/78; 327/502
(58) Field of Search ............................... 327/78–82, 88, 327/427, 434, 437, 389, 502, 584, 18, 20, 26

(56) References Cited

U.S. PATENT DOCUMENTS 5,781,039 A * 7/1998 Carlberg ........................ 327/44

FOREIGN PATENT DOCUMENTS

WO    WO 93/23772    11/1993

OTHER PUBLICATIONS

Application of "Fail–safe Multi–Valued Logic to Optical Sensor Scanning Circuit", Kato et al., National Meeting of the Japanese Institute of Electrical Engineers, 699, 1993, pp. 124–125.

* cited by examiner

*Primary Examiner*—My-Trang Nu Ton
(74) *Attorney, Agent, or Firm*—McDermott, Will & Emery

(57) ABSTRACT

The invention relates to a threshold value operation circuit which can perform an analogue type threshold value operation, and which can generate an AC signal with a stabilized frequency and duty ratio which is not influenced by input signal level or characteristic changes of the circuit elements and the like. A switching device (SWa) is switched by a switching signal (Sg) from an external AC source, to modulate an input signal (Vi) which is the subject of a threshold value operation. A modulation signal (V1) thereof is level detected by a level detection circuit (10) having a previously set threshold value, and if within a range of a predetermined level, an AC output (Vo) is generated from the level detection circuit (10).

27 Claims, 27 Drawing Sheets

(A)

(B)

(A)

(B)

(A)

(B)

(A)

(B)

US 6,392,451 B1

THRESHOLD VALUE OPERATION CIRCUIT, AND, AND GATE CIRCUIT, SELF HOLD CIRCUIT, START SIGNAL GENERATION CIRCUIT USING THRESHOLD VALUE OPERATION CIRCUIT

TECHNICAL FIELD

The present invention relates to a threshold value operation circuit which performs a threshold value operation on a level of an input signal, and generates an AC (alternating current) signal when at a set level (corresponding to logic value 1), and does not generate an AC signal when not at the set level (corresponding to logic value 0). In particular the invention relates to a threshold value operation circuit which can perform an analogue type threshold value operation, and which can generate an AC signal of stabilized frequency and duty ratio when an input signal is a set level, and to an AND gate circuit, a self hold circuit, and a start signal generating circuit to which this threshold hold value operation circuit is applied.

BACKGROUND ART

With signal processing in safety equipment and the like, where fail-safe characteristics are required, the presence of an AC signal is processed as a logic value 1 and the absence of an AC signal is processed as a logic value 0. Finally a threshold value operation is carried out on the AC signal and a judgement is made as to whether or not this is within a predetermined level, and a signal indicating safety or danger is output.

As one example of a conventional threshold value operation circuit applicable to such fail-safe signal processing, there is for example a fail-safe window comparator/AND gate. The circuit construction and operation of this is shown in for example Trans. IEE of Japan, Vol. 109-C, No. 9, September 1989 under the heading "A Structural Method for an Interlock System using a Fail-safe Logic Element having Window Characteristics". Moreover, this is also shown in the specifications of U.S. Pat. No. 4,661,880, U.S. Pat. No. 5,027,114, and in the disclosure of Examined Japanese Patent Publication No. 1-23006.

Representative circuit examples thereof are shown in FIG. 31(A) and FIG. 31(B).

FIG. 31(A) is a window comparator having a level detection function. When a level LI of an input I is in a range $(r1+r2+r3)E/r3 < L1 < (r4+r5)E/r5$ (where E is the circuit power source voltage, and r1~r5 are the resistance values of resistors R1~R5), the circuit self oscillates with respective transistors Q1~Q3 repeating an on/off operation in a process of Q2: OFF→Q3: OFF→Q1: ON→Q2: ON→Q3: ON→Q1: OFF→Q2: OFF→ . . .

Furthermore, FIG. 31(B) is a circuit having a level detection function and an AND function, with two window comparators as shown in FIG. 31(A) connected in cascade. When the levels LI1, LI2 of the inputs 11, 12 are respectively in the range of $(r1+r2+r3)E/r3 < LI1 < (r4+r5)E/r5$, and $(r1'+r2'+r3')E/r3' < LI2 < (r4'+r5')E/r5'$ (where E is the circuit power source voltage, and r1'~r5' are the resistance values of resistors R1'~R5'), the circuit self oscillates, and if even one of L1 and LI2 goes outside of the abovementioned range, oscillation stops.

Furthermore, as another threshold value operation circuit, there is for example the one disclosed in Japanese Unexamined Patent Publication No. 8-162940, previously proposed by the present applicants. This is shown in FIG. 32.

With the circuit of FIG. 32, if an output X2 from an envelope detection circuit A based for example on an AC signal $V_{IN}$ exceeds a power source voltage Vcc, then due to a switching (on/off) of a photocoupler PC1 which receives an AC signal from a separately provided AC source, a switching current intermittently flows in a photodiode of a photocoupler PC2 via a current decreasing resistor R. Hence a phototransistor of the photocoupler PC2 switches (on/off), and an AC signal is generated (output is logic value 1). When an AC signal $V_{IN}$ is not input to the envelope detection circuit A, the output X2 from the envelope detection circuit A becomes approximately the power source voltage Vcc. Hence even if the photocoupler PC1 switches, a switching current does not flow to the photocoupler PC2, and an AC signal is not generated (output is logic value 0). The envelope detection circuit B voltage doubler rectifies the AC signal due to the switching of the phototransistor of the photocoupler PC2, and outputs a DC (direct current) signal Y which is larger than the power source voltage Vcc.

However, the threshold value operation circuit which uses the window comparator of FIG. 31 is a self-oscillation circuit, and the oscillation frequency and duty ratio are approximately determined by the on and off delay time of the respective transistors. Therefore due to changes in the characteristics of the transistors resulting from variations in transistor characteristics, temperature and humidity and the like, or due to the input signal level, the oscillation frequency and the duty ratio of the AC output change, so that there is the problem in that a stabilized AC output cannot be obtained. Moreover, this threshold value operation circuit uses processing outside of the power source limits (when an input signal of a predetermined level greater than the circuit power source voltage is input, an AC signal is generated), and must satisfy relationships where the input signal level and the threshold value of the window comparator both change in proportion to the circuit power source voltage. Therefore, there is the restriction that the input signal oscillation circuit and the window comparator must use the same power source. Hence the degree of freedom for circuit layout is low.

On the other hand, with the threshold value operation circuit of FIG. 32, since the construction is such that the AC signal from an external AC source is used to give oscillation, the oscillation frequency and the duty ratio are not susceptible to influence from the characteristics of the circuit elements or the input level, and hence a stabilized AC signal can be obtained. However, this circuit confines itself to judging as to whether or not the input signal is greater than the circuit power source voltage Vcc, in other words to digital judging for the presence or absence of the input signal, and does not have an analogue threshold value detection function for the input signal.

The present invention takes into the consideration the above situation, with the object of providing a threshold value operation circuit, which can perform an analogue threshold value operation, and which can generate an output AC signal of stabilized frequency and duty ratio, and for which the circuit layout degree of freedom is high. Moreover, it is an object to provide an AND gate circuit, a self hold circuit and a start signal generation circuit to which this threshold hold value operation circuit is applied.

DISCLOSURE OF THE INVENTION

Accordingly, with the present invention, there is provided a threshold value operation circuit which comprises; a modulation device for modulating an input signal by means of a switching signal from an AC (alternating current) source, and a level detection device for level detecting the input signal by comparing this with a previously set threshold value, and is constructed such that an input signal subject to threshold value operation is input to one device of the modulation device and level detection device, and an output from the one device is input to the other device, and which generates an AC signal when based on a level detection result of the level detection device, a level of the input signal subject to threshold value operation is a set level.

More specifically, the construction may be such that the input signal subject to threshold value operation is input to the modulation device, and a modulation signal modulated by the modulation device is input to the level detection device, and the level detection device generates an AC signal when the modulation signal is a set level. Furthermore, the construction may be such that the input signal subject to threshold value operation is input to the level detection device and level detected, and a signal which has been level detected by the level detection device is modulated by the modulation device. Moreover, the construction may be such that there is provided an AC signal generating device for generating an AC signal which is switched by input of a modulation signal modulated by the modulation device.

With such a construction, an analogue type threshold value operation becomes possible with respect to the input signal subject to threshold value operation. Furthermore, an AC output which is synchronized with a switching signal from outside can be obtained, so that an AC output of stabilized frequency and duty ratio which is not influenced by characteristic changes and the like of the circuit elements can be obtained.

With the modulation device the construction may be such that a switch device is switched by the switching signal from the AC source, to modulate an input signal. In this case, if the switch device is a photocoupler which is switched by input of the switching signal from the AC source, then the AC source side and the input side of the level detection device can be isolated. Moreover, if the switch device is a transistor, then switching at high speed becomes possible.

In the case where a transistor is used in the switch device, the switching signal may have an amplitude of a range between the input signal and the voltage of the constant voltage supply line, and a signal which does not cross over the threshold value of the level detection device may be used for the switching signal input to the transistor. With such a construction, then even if with a fault in the transistor, the switching signal is input directly to the level detection device, the problem where an AC signal is generated from the level detection device by the switching signal regardless of the input signal does not arise.

The construction may be such that the modulation device incorporates a buffer circuit which takes the input of the AC source switching signal, and supplies this to an input line to which the input signal is applied.

In the case where the level detection device comprises a comparator, the construction may be such that the AC output from the comparator is transmitted to an output circuit side via a photocoupler. With such a construction, the respective power supplies for the output circuit side and the threshold value operation circuit side can be made independent, so that the degree of freedom for the layout of the threshold value operation circuit is increased.

Furthermore, the level detection device constructed to incorporate a Zenner diode and a photocoupler for generating an AC signal which is switched by an output from the Zenner diode. In the case of this construction, the degree of freedom for the layout of the threshold value operation circuit is increased.

The threshold value operation circuit of the present invention comprises: a first Zenner diode for level detecting an input signal subject to threshold value operation; a switch device which is switched by a switching signal from an AC source, for modulating an output signal from the first Zenner diode; a first photocoupler which is switched by input of a modulation signal modulated by the switch device, for modulating the input signal subject to threshold value operation; a second Zenner diode for level detecting a modulation signal of the input signal subject to threshold value operation which has been modulated by the switching operation of the first photocoupler; and a second photocoupler which is switched by an output signal from the second Zenner diode, for generating an AC signal, and when the level of the input signal subject to threshold value operation is a set level, an AC signal is generated from the second photocoupler.

With such a construction, since the upper limit threshold value and the lower limit threshold value can be set independently, the generation of an AC output when the Zenner diode is short-circuited can be prevented.

An AND gate circuit which uses a threshold value operation circuit of the present invention comprises a plurality of threshold value operation circuits connected in cascade each of which comprises; a modulation device for modulating an input signal by means of a switching signal from an AC (alternating current) source, and a level detection device for level detecting the input signal by comparing this with a previously set threshold value, and is constructed such that an input signal subject to threshold value operation is input to one device of the modulation device and level detection device, and an output from the one device is input to the other device, and which generates an AC signal when based on a level detection result of the level detection device, a level of the input signal subject to threshold value operation is a set level, wherein an AC output from a former stage threshold value operation circuit is input as a switching signal to a modulation device of a latter stage threshold value operation circuit, instead of an AC source.

Another AND gate circuit of present invention comprises: a threshold value circuit, and outputs the added values for all of the AC input signals fro operation circuit which comprises; a modulation device for modulating an input signal by means of a switching signal from an AC (alternating current) source, and a level detection device for level detecting the input signal by comparing this with a previously set threshold value, and is constructed such that an input signal subject to threshold value operation is input to one device of the modulation device and level detection device, and an output from the one device is input to the other device, and which generates an AC signal when based on a level detection result of the level detection device, a level of the input signal subject to threshold value operation is a set level; and an adder circuit comprising a plurality of rectifying circuits for respectively rectifying AC input signals, which sequentially adds a rectified output from a first stage rectifying circuit to a rectified output from a next stage rectifying circuit, and outputs the added values for all of the AC input signals from a final stage rectifying circuit, wherein the addition output from the adder circuit is supplied as the input signal subject to threshold value operation of the threshold value operation circuit.

A self hold circuit of the present invention which uses a threshold value operation circuit comprises two threshold value operation circuits each of which comprises; a modulation device for modulating an input signal by means of a switching signal from an AC (alternating current) source, and a level detection device for level detecting the input signal by comparing this with a previously set threshold value, and is constructed such that an input signal subject to threshold value operation is input to one device of the modulation device and level detection device, and an output from the one device is input to the other device, and which generates an AC signal when based on a level detection result of the level detection device, a level of the input signal subject to threshold value operation is a set level, wherein one threshold value operation circuit is made a trigger circuit and the other threshold value operation circuit is made a hold circuit, and an AC signal which is generated based on a logical sum operation on an output from the trigger circuit and an output from the hold circuit is input to a modulation device of the hold circuit as a switching signal instead of an AC source.

Moreover, another self hold circuit of the present invention comprises: a threshold value operation circuit which comprises; a modulation device for modulating an input signal by means of a switching signal from an AC (alternating current) source, and a level detection device for level detecting the input signal by comparing this with a previously set threshold value, and is constructed such that an input signal subject to threshold value operation is input to one device of the modulation device and level detection device, and an output from the one device is input to the other device, and which generates an AC signal when based on a level detection result of the level detection device, a level of the input signal subject to threshold value operation is a set level; and an adder circuit comprising two rectifying circuits for respectively rectifying AC input signals, which adds a rectified output from a former stage rectifying circuit to a rectified output from a latter stage rectifying circuit, and outputs the added values of the two AC input signals from the latter stage rectifying circuit, wherein the addition output from the adder circuit is supplied to an input terminal of the threshold value operation circuit as the input signal subject to threshold value operation, and an input terminal of the latter stage rectifying circuit of the adder circuit is made a hold input terminal, and an input terminal of the former stage rectifying circuit is made a trigger input terminal, and the AC output signal from the threshold value operation circuit is rectified and then fad back to an output terminal of the former stage rectifying circuit.

A start signal generating circuit of the present invention which uses a threshold value operation circuit comprises: a start switch comprising a first contact point and a second contact point having a complimentary relation to each other for on/off switching; a capacitor which is charged via the first contact point which comes on when the start switch is pressed, and which is discharged via the second contact point which comes on when the start switch returns, for generating an output signal; and a threshold value operation circuit which comprises; a modulation device for modulating an input signal by means of a switching signal from an AC (alternating current) source, and a level detection device for level detecting the input signal by comparing this with a previously set threshold value, and is constructed such that an input signal subject to threshold value operation is input to one device of the modulation device and level detection device, and an output from the one device is input to the other device, and which generates an AC signal when based on a level detection result of the level detection device, a level of the input signal subject to threshold value operation is a set level; wherein the output signal from the capacitor is made the input signal subject to threshold value operation of the threshold value operation circuit, and the output from the threshold value operation circuit is made a start signal for a machine or the like.

With such a construction, only when the two contact points of the start switch are operating normally, and the start signal level is a set level, is an AC signal generated from the threshold value operation circuit, so that a start signal for a machine or a like can be generated.

Another start signal generating circuit of the present invention comprises a first and a second threshold value operation circuits each of which comprises; a modulation device for modulating an input signal by means of a switching signal from an AC (alternating current) source, and a level detection device for level detecting the input signal by comparing this with a previously set threshold value, and is constructed such that an input signal subject to threshold value operation is input to one device of the modulation device and level detection device, and an output from the one device is input to the other device, and which generates an AC signal when based on a level detection result of the level detection device, a level of the input signal subject to threshold value operation is a set level, wherein an AC output from the first threshold value operation circuit is input to the modulation device of the second threshold value operation circuit as a switching signal instead of the AC source, and wherein a power source voltage level is subject to a threshold value operation by the first threshold value operation circuit, and an output signal which is generated based on an ON operation of an operation button is made the input signal subject to threshold value operation of the second threshold value operation circuit, and the output from the second threshold value operation circuit is made a start signal for a machine or the like.

Another start signal generating circuit of the present invention comprises a self hold circuit provided with two threshold value operation circuits each of which comprises; a modulation device for modulating an input signal by means of a switching signal from an AC (alternating current) source, and a level detection device for level detecting the input signal by comparing this with a previously set threshold value, and is constructed such that an input signal subject to threshold value operation is input to one device of the modulation device and level detection device, and an output from the one device is input to the other device, and which generates an AC signal when based on a level detection result of the level detection device, a level of the input signal subject to threshold value operation is a set level, wherein one threshold value operation circuit is made a trigger circuit and the other threshold value operation circuit is made a hold circuit, and an AC signal which is generated based on a logical sum operation on an output from the trigger circuit and an output from the hold circuit being input to a modulation device of the hold circuit as a switching signal instead of an AC source, wherein an output signal generated in accordance with the on/off operation of a start switch comprising first and second contact points having a complimentary relation to each other for on/off switching, is input to the trigger circuit of the self hold circuit as the input signal subject to threshold value operation, and only when the input signal subject to threshold value operation is a set level, and the input signal level to the hold circuit is a set level, is a start signal generated from the self hold circuit.

BEST MODE FOR CARRYING OUT THE INVENTION

As follows is a description of embodiments according to the present invention based on the appended drawings.

Figure 1:
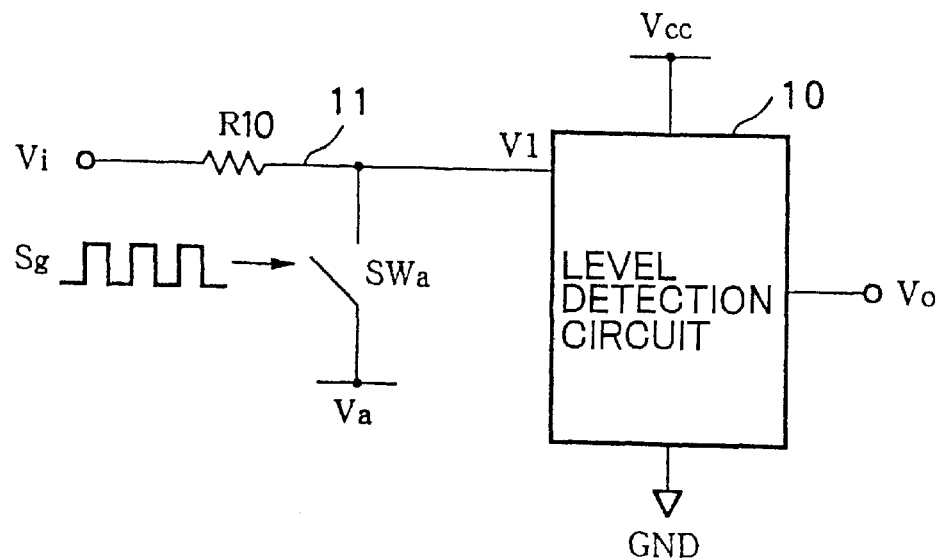
FIG. 1 is a structural diagram of a first embodiment of a threshold value operation circuit of the present invention.

FIG. 1 shows a circuit structure diagram of a first embodiment of a threshold value operation circuit according to the present invention.

In FIG. 1, a level detection circuit 10 serving as a level detection device, has a threshold value Vt, and when a modulation signal V1 of an input signal Vi subject to threshold value operation to be described later is higher than the threshold value Vt, an output Vo becomes for example GND level, and when the modulation signal V1 is equal to or less than the threshold value Vt, the output Vo becomes a Vcc level. Hereunder the abovementioned input/output relationship is described. However an opposite relationship, that is where the output Vo of the level detection circuit becomes the Vcc level when the modulation signal V1 is higher than the threshold value Vt, and the output Vo becomes the GND level when the modulation signal V1 is equal to or less than the threshold value Vt is also acceptable from an operation point of view.

A switch SWa has one terminal side connected to an input line 11 of the input signal Vi which constitutes a signal line for an input side and output side, and another terminal side connected to a supply line of a constant voltage Va. Furthermore the arrangement where the switch SWa is switched on/off in synchronous with a switching signal Sg from a separately provided external AC power supply (not shown), to modulate the input signal Vi and generate the modulation signal V1 and input this to the level detection circuit 10 constitutes a modulation device. The input signal Vi is a DC (direct current) signal, which is modulated by the switch SWa via a resistor R10 disposed in the input line 11, and input to the level detection circuit 10.

Next is the description of the operation of the first embodiment of FIG. 1.

With this circuit, when the switch SWa is switched on, the modulation signal V1 for input to the level detection circuit 10 becomes a voltage Va. When the switch is switched off, if the input impedance of the level detection circuit 10 as seen from GND level is Rc, then V1=Rc·Vi/(r10+Rc) results (where r10 is the resistance value of the resistor R10).

Here in the case where Va<Vt (Vt: threshold value voltage of the level detection circuit 10), then so that the output Vo from the level detection circuit 10 becomes an alternating current synchronous with the on/off switching of the switch SWa, V1 when the switch SWa is off must be V1=Rc·Vi/(r10+Rc)>Vt, and Vi>(r10+Rc) Vt/Rc must be satisfied. Consequently, in the case where Va<Vt, the threshold value operation circuit of FIG. 1 has a lower limit threshold value with respect to the input signal Vi. With the lower limit threshold value VtiL, from $Rc \cdot VtiL/(r10+Rc)=Vt$, gives $VtiL=(r10+Rc)Vt/Rc$. Furthermore, when the input signal Vi is Vi>VtiL, the output Vo from the level detection circuit 10 alternates as Vcc/GND, in synchronous with the on/off operation of the switch SWa due to the switching signal Sg from the external AC power supply, so that the output Vo becomes an AC (alternating current) signal (logic value 1) synchronous with the switching of the switch SWa. On the other hand, in the case where Vi≦VtiL, the output Vo from the level detection circuit 10 does not change, remaining at a fixed value (as Vcc) even if the switch SWa is switched on/off, so that the output becomes a DC signal (logic value 0).

Next in the case where Va>Vt, then so that the output Vo from the level detection circuit 10 becomes an alternating current in synchronous with the on/off switching of the switch SWa, V1 when the switch SWa is off must be $V1=Rc \cdot Vi/(r10+Rc)<Vt$, and $Vi <(r10+Rc)Vt/Rc$ must be satisfied. Consequently, in the case where Va>Vt, the threshold value operation circuit of FIG. 1 has an upper limit threshold value with respect to the input signal Vi. With the upper limit threshold value VtiH, from $Rc \cdot VtiH/(r10+Rc)=Vt$, gives $VtiH=(r10+Rc)Vt/Rc$. Furthermore, when the input signal Vi is Vi<VtiH, the output Vo from the level detection circuit 10 alternates as Vcc/GND, in synchronous with the on/off operation of the switch SWa due to the switching signal Sg from the external AC power supply, to give an AC signal. On the other hand, in the case where Vi≧VtiH, the output Vo from the level detection circuit 10 does not change, remaining at a fixed value (as GND) even if the switch SWa is switched on/off, so that an AC signal is not output.

In the above manner, with the threshold value operation circuit of the construction of FIG. 1, by selecting a value for the voltage Va with respect to the threshold value Vt of the level detection circuit 10, the lower limit threshold value operation and the upper limit threshold value operation can be selected with respect to the input signal Vi.

Figure 2:
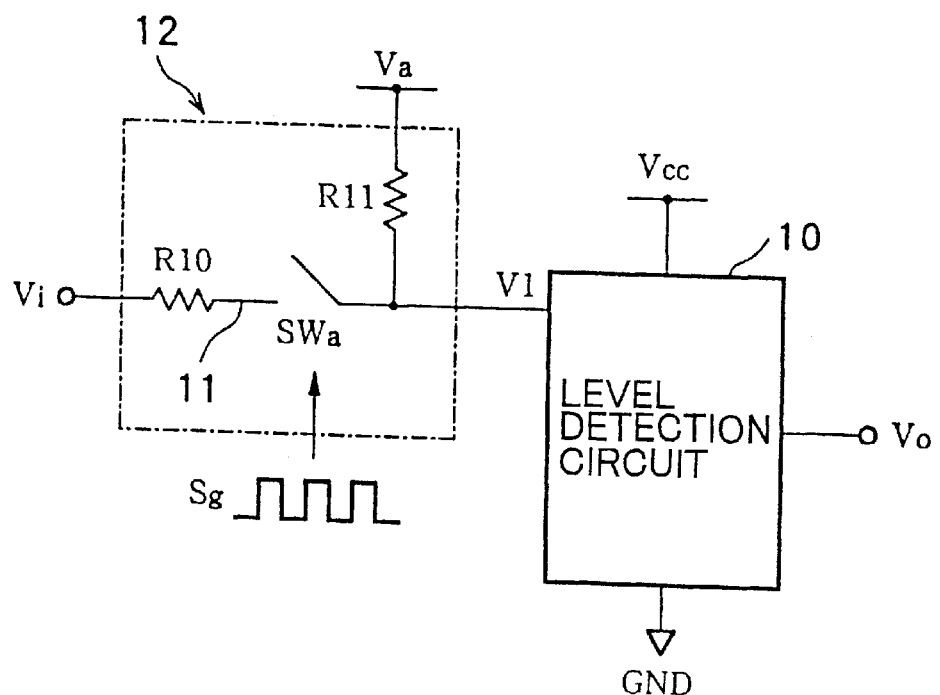
FIG. 2 is a structural diagram of a second embodiment of a threshold value operation circuit of the present invention.

FIG. 2 is a circuit structure example of another embodiment where it is possible to select the upper limit/lower limit threshold value operation as in FIG. 1. Components the same as in FIG. 1 are denoted by the same reference symbols and description thereof is omitted.

With the embodiment of FIG. 2, the construction is such that a first resistor R10 and a switch SWa are disposed in series in an input line 11 for an input signal Vi, being the signal line for the input side and output side, and a second resistor R11 is provided with one end connected between the switch SWa and an input terminal of a level detection circuit 10, and the other end connected to a supply line of a constant voltage Va. In this case, a modulation circuit 12 serving as a modulation device is constructed from the first and second resistors R10 and R11, and the switch SWa.

Next is a Description of the Operation of the Circuit of FIG. 2

When the switch SWa is off, the input V1 (modulation signal) to the level detection circuit 10 becomes $V1 (OFF)=Va \cdot Rc/(r11+Rc)$. When the switch SWa is on, the input V1 becomes $V1 (ON)=(r11 \cdot Rc \cdot Vi+r10 \cdot Rc \cdot Va)/(r10 \cdot r11+r10 \cdot Rc+r11 \cdot Rc)$. To simplify description, making Rc>>r10, r11, then $V1 (OFF) \approx Va$, and $V1 (ON) \approx (r11 \cdot Vi+r10 \cdot Va)/(r10+r11)$.

When Va is determined so that $V1 (OFF) \approx Va<Vt$, then so that the output Vo from the level detection circuit 10 becomes an AC signal, the input V1 (ON) when the switch SWa is on must be $V1 (ON) \approx r11 \cdot Vi+r10 \cdot Va)/(r10+r11)>Vt$. Consequently, the circuit of FIG. 2, as with FIG. 1, becomes a threshold value operation circuit having a lower limit threshold value $VtiL=Vt+(Vt-Va) r10/r11$ with respect to the input signal Vi.

On the other hand, when Va is determined so that $V1 (OFF) \approx Va>Vt$, then so that the output Vo from the level detection circuit 10 becomes an AC signal, the input V1 (ON) when the switch SWa is on must be $V1 (ON) \approx r11 \cdot Vi+r10 \cdot Va)/(r10+r11)<Vt$. In this case, the circuit of FIG. 2 becomes a threshold value operation circuit having an upper limit threshold value $VtiH=Vt+(Vt-Va)r10/r11$ with respect to the input signal Vi.

In the above manner, in the case of the circuit structure of FIG. 2 also, the lower limit threshold value operation and the upper limit threshold value operation can be selected using the value of the voltage Va.

Figure 3:
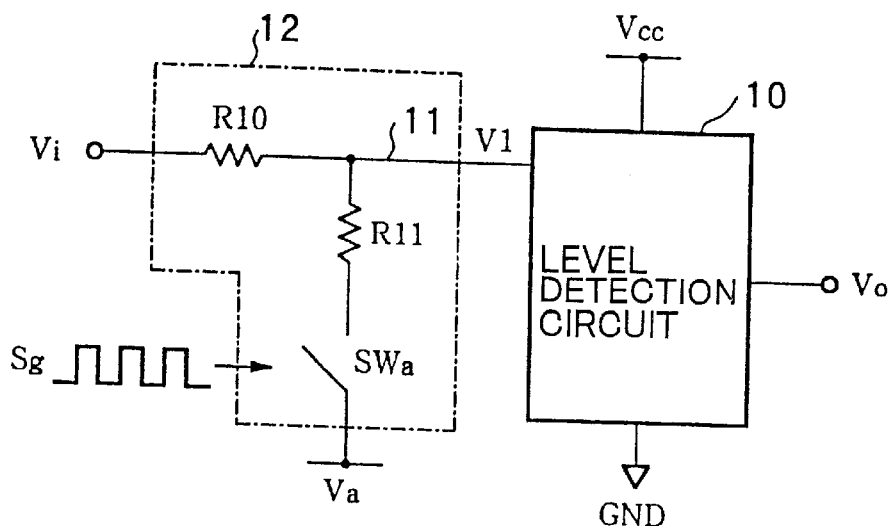
FIG. 3 is a structural diagram of a third embodiment of a threshold value operation circuit of the present invention.

Next, FIG. 3 shows a circuit diagram of a third embodiment. This is an example of where the threshold value operation circuit has both an upper limit and lower limit threshold value.

In FIG. 3, with this embodiment the construction is such that a series circuit of a switch SWa and a second resistor R11 is connected to an input line 11 between a first resistor R10 and an input terminal of a level detection circuit 10.

Next is a Description of the Operation

As with the case of FIG. 2, when the switch SWa of a modulation circuit 12 is off, then $V1 (OFF)=Rc \cdot Vi/(r10+Rc)$. When the switch SWa is on, then $V1 (ON)=(r11 \cdot Rc \cdot Vi+r10 \cdot Rc \cdot Va)/(r10 \cdot r11+r10 \cdot Rc+r11 \cdot Rc)$. Taking Rc>>r10, r11 in the same way as mentioned before, then $V1 (OFF) \approx Vi$, and $V1 (ON) \approx (r11 \cdot Vi+r10 \cdot Va)/(r10+r11)$.

Furthermore, here Vi takes the range of Vcc<Vi<2Vcc. For example, taking Va=Vcc (that is Va<Vi min), gives $V1 (OFF) \approx Vi>V1 (ON) \approx (r11 \cdot Vi+r10 \cdot Vcc)/(r10+r11)$. Looking at the circuit behavior corresponding to the level of the input signal Vi, then with $V1 (OFF) \approx Vi<Vt$, the output Vo from the level detection circuit 10 is fixed at Vcc even if the switch SWa is switched on/off. Moreover, with $V1 (ON) \approx (r11 \cdot Vi+r10 \cdot Vcc)/(r10+r11)>Vt$, the output Vo from the level detection circuit 10 is fixed at GND even if the switch SWa is switched on/off. The range where the output Vo from the level detection circuit 10 becomes a Vcc/GND AC signal synchronous with the on/off switching of the switch SWa, is where $V1 (OFF) \approx Vi>Vt>V1 (ON) \approx (r11 \cdot Vi+r10 \cdot Vcc)/(r10+r11)$. Consequently, for the lower limit threshold value VtiL and the upper limit threshold value VtiH, from $V1 (OFF) \approx VtiL=Vt$, and $V1 (ON) \approx (r11 \cdot VtiH+r10 \cdot Vcc)/(r10+r11)=Vt$, these respectively become VtiL=Vt, and $VtiH=Vt+(Vt-Vcc)r10/r11$. Therefore the circuit of FIG. 3 has the function of a window comparator which generates an AC signal output Vo from the level detection circuit 10 only when the input signal Vi is within the abovementioned range of VtiL~VtiH.

Incidentally, making Va=2Vcc (that is Va>Vi max), gives $V1 (OFF) \approx Vi<V1 (ON) \approx (r11 \cdot Vi+r10 \cdot 2Vcc)/(r10+r11)$. In the same way as described before, the output Vo is fixed for either of $V1 (ON) \approx (r11 \cdot Vi+r10+2Vcc)/(r10+r11)<Vt$, and $V1 (OFF) \approx Vi>Vt$. Only in the range of $V1 (OFF) \approx Vi<Vt<V1 (ON) \approx (r11 \cdot Vi+r10 \cdot 2Vcc)/(r10+r11)$ does an AC signal appear in the output Vo from the level detection circuit 10, synchronous with the on/off switching of the switch SWa. For the lower limit threshold value VtiL and the upper limit threshold value VtiH, from $V1 (ON) \approx (r11 \cdot VtiL+r10 \cdot 2Vcc)/(r10+r11)=Vt$, and $V1 (OFF) \approx VtiH=Vt$, these respectively become $VtiL=Vt-(2Vcc-Vt)r10/r11$, and VtiH=Vt. From the above, the circuit of FIG. 3 has the function of a window comparator which generates an AC signal output Vo from the level detection circuit 10 only when the input signal Vi is within the abovementioned range of VtiL~VtiH.

In this manner, with the construction of FIG. 3, there results a threshold value operation circuit having various threshold value ranges with upper limits and lower limits with respect to the input signal Vi subject to threshold value operation.

Figure 4:
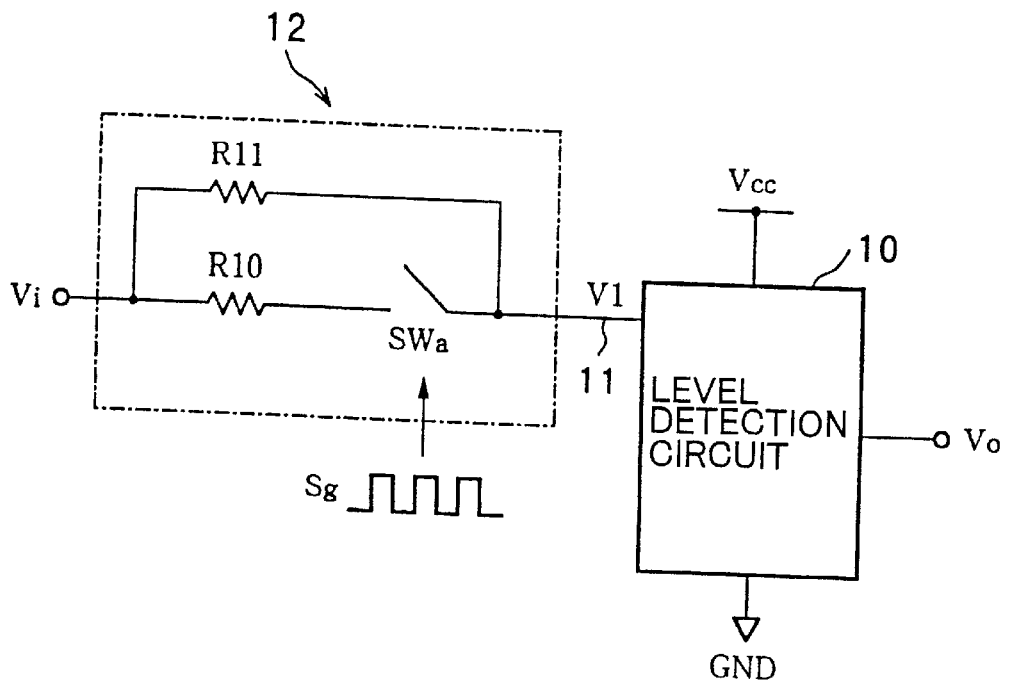
FIG. 4 is a structural diagram of a fourth embodiment of a threshold value operation circuit of the present invention.

FIG. 4 shows another circuit structural example having an upper and lower limit threshold value.

With the circuit of FIG. 4, the construction is such that a second resistor R11 is connected in parallel with a series circuit of a first resistor R10 and a switch Swa, disposed in series in an input line 11 between an input terminal of an input signal Vi and an input terminal of a level detection circuit 10.

Next is the Description of the Operation.

When the switch SWa is off, then input V1 (OFF)=Vi·Rc/(r10+Rc). When the switch SWa is on, then input V1 (ON)=Vi·Rc/(r10∥r11+Rc) (here r10∥r11=r10·r11/(r10+r11)). Since V1 (OFF)<V1 (ON), then with V1 (OFF)>Vt or V1 (ON)<Vt, the output Vo from the level detection circuit 10 is fixed at a constant voltage. Consequently, with the circuit of FIG. 4 when V1 (OFF)<Vt<V1 (ON), that is, only in the range of (r10∥r11+Rc)Vt/Rc<Vi<(r10+r11)Vt/Rc, does an AC signal appear in the output Vo from the level detection circuit 10, synchronous with the switching operation of the switch SWa. The lower level threshold value of the circuit of FIG. 4 is VtiL=(r10∥r11+Rc)Vt/Rc, while the upper limit threshold value is VtiH=(r10+r11)Vt/Rc.

In this way, if the construction is such that the input signal Vi subject to threshold value operation, is modulated by a signal Sg from an external AC source, and this modulation signal is level detected, then this give an AC output synchronized with the switching signal of the external AC source. Hence, an AC output signal can be obtained with a stabilized frequency and duty ratio, which is not influenced from, for example input signal level changes or characteristic changes of the circuit elements. Moreover, the threshold value operation on the input signal can be performed as an analogue operation. Furthermore, since the input signal generation source and the level detection device can have different power sources, this has the effect of increasing the degree of freedom of the layout of the threshold value operation circuit or the input signal generation source.

FIG. 5(A) and FIG. 5(B) are specific examples of the switch SWa applicable to the circuits of FIG. 1 through FIG. 4, with FIG. 5(A) being an example using a photocoupler, and FIG. 5(B) being an example using a transistor.

With the switch circuit of FIG. 5(A), a photocoupler PC10 incorporates a light emitting diode PDa and a phototransistor PTa. A switching signal Sg from an external AC source 13 is supplied via a resistor Ra to the light emitting diode PDa.

For example, when the switching signal Sg is an H level, a current flows in the light emitting diode PDa so that the phototransistor PTa receives light and comes on. When the switching signal Sg is an L level, a current does not flow in the light emitting diode PDa, and the phototransistor PTa goes off. Consequently, by switching the phototransistor PTa on/off in synchronous with the switching signal Sg, the input signal Vi is modulated, and the modulation signal V1 is generated.

With the switching circuit of FIG. 5(B), a switching signal Sg from an AC source 13 is level converted by a capacitor Ca and transmitted to a resistor Ra1. When the switching signal Sg is an H level, a level higher than at point A in the figure is produced at point B, and a base current is supplied to the transistor Tr via the resistor Ra1 so that the transistor Tr comes on. When the switching signal Sg is an L level, point B becomes approximately the same level as point A so that a base current is not supplied and the transistor Tr goes off. In the case of this circuit also, by switching the transistor Tr on/off in synchronous with the switching signal Sg, the input signal Vi is modulated so that the modulation signal V1 is produced. A resistor Ra2 is provided in order to stabilize the off condition of the transistor Tr, while a diode Da is provided so that when the switching signal Sg is an L level, the capacitor Ca can be rapidly charged.

Figure 5:
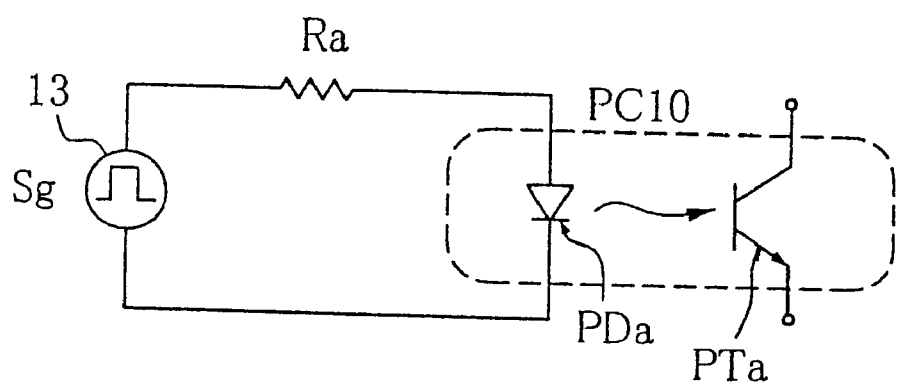
FIG. 5(A) and FIG. 5(B) are specific circuit diagrams of switches in the above respective embodiments, FIG. 5(A) being an example of where a photocoupler is used, and FIG. 5(B) being an example of where a transistor is used.
Figure 5:
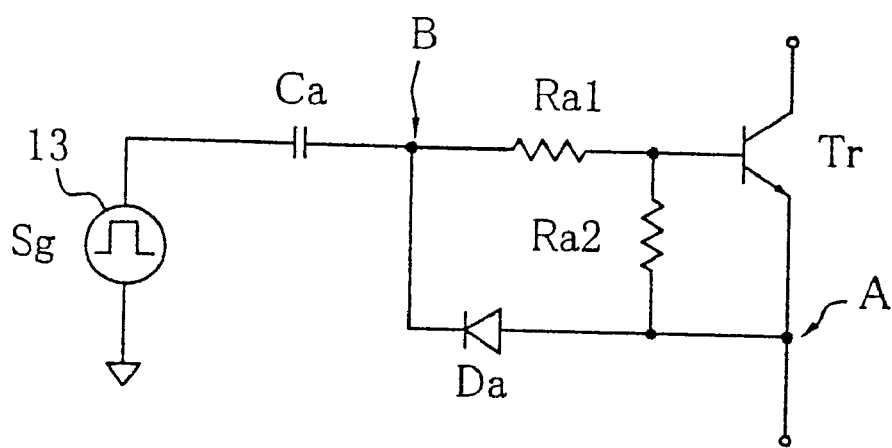

In the case of the switching circuits of either (A) or (B) of FIG. 5, in the case where a fault occurs in the respective elements, the switching operation of the phototransistor PTa, and of the transistor Tr is stopped, thus fixing the switching circuit in the on condition or the off condition.

Figure 6:
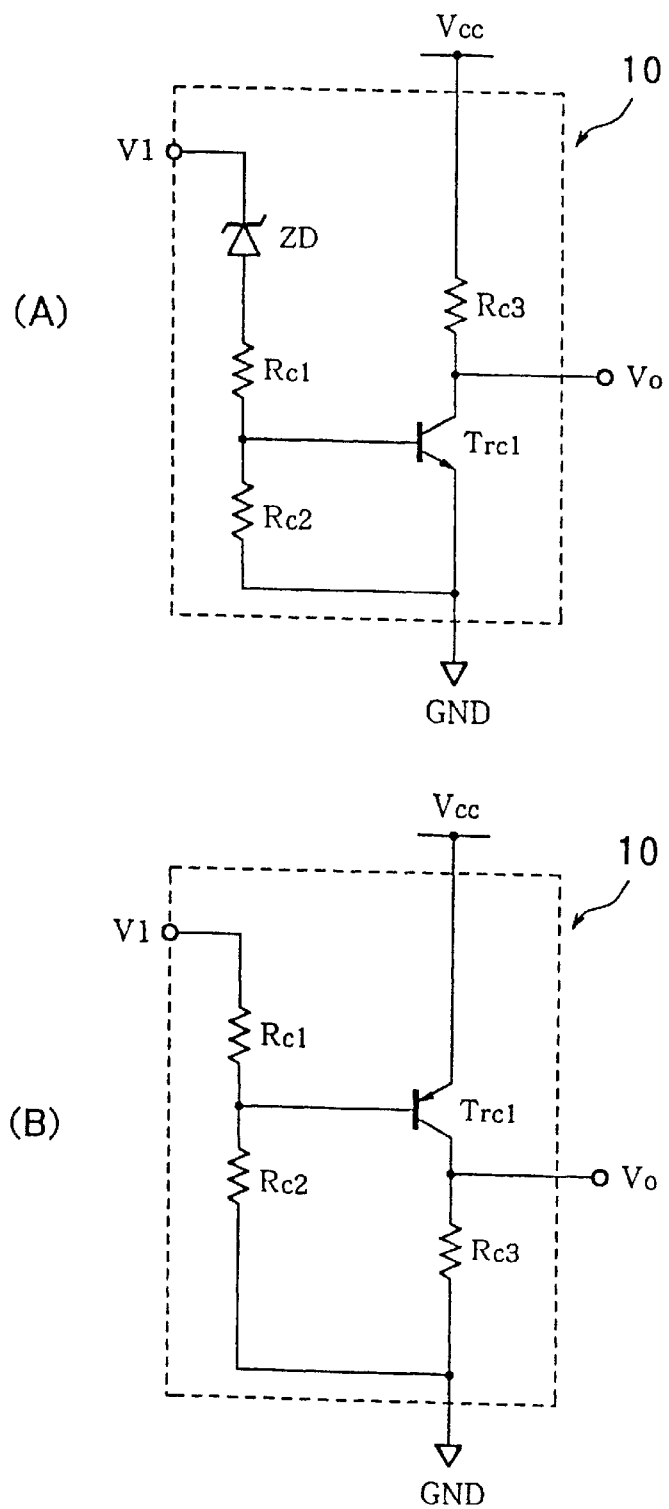
FIG. 6(A) and FIG. 6(B) are respective specific circuit diagrams of level detection circuits of the above respective embodiments.

FIG. 6(A) and FIG. 6(B) are specific circuit examples of a comparator which can be applied to the level detection circuits of FIG. 1 through FIG. 4.

With the circuit construction of FIG. 6(A), the input threshold value voltage Vt is obtained with a Zenner voltage of a Zenner diode ZD as Vzd, and an ON voltage between an emitter and base of a transistor Trc1 (here an NPN transistor) as Vbe. The limit for the input level for where the level of the output Vo from the comparator 10 (level detection circuit) changes from Vcc→GND (or from GND→Vcc) is the threshold value voltage Vt. With this circuit, the input level which becomes the limit for the change of the transistor Trc1 from OFF→ON (or from ON→OFF) becomes Vt (that is, the minimum voltage for switching the transistor Trc1 on with an increase in the input V1 level is Vt).

With this circuit, Vt=Vzd+(1+rc1/rc2) Vbe (rc1, rc2 are the resistance values of the resistors Rc1, Rc2). When the level of the input V1 (modulation signal) is greater than Vt, the transistor Trc1 comes on so that the output level becomes GND level, while when the input level is equal to or less than Vt, the transistor Trc1 goes off so that the output level becomes the Vcc level.

With the circuit construction of FIG. 6(B), when the level of the input V1 is increased, the threshold value voltage Vt is a minimum voltage where the transistor Trc1 (here a PNP transistor) goes off, and when the ON voltage between the emitter and base of the transistor Trc1 becomes Vbe (>0), then Vt=(1+rc1/rc2)·(Vcc−Vbe). When the level of the input V1 is higher than Vt, the transistor Trc1 goes off and the output level becomes GND level. When the level of the input V1 is equal to or less than Vt, the transistor Trc1 comes on and the output level becomes Vcc level.

Figure 7:
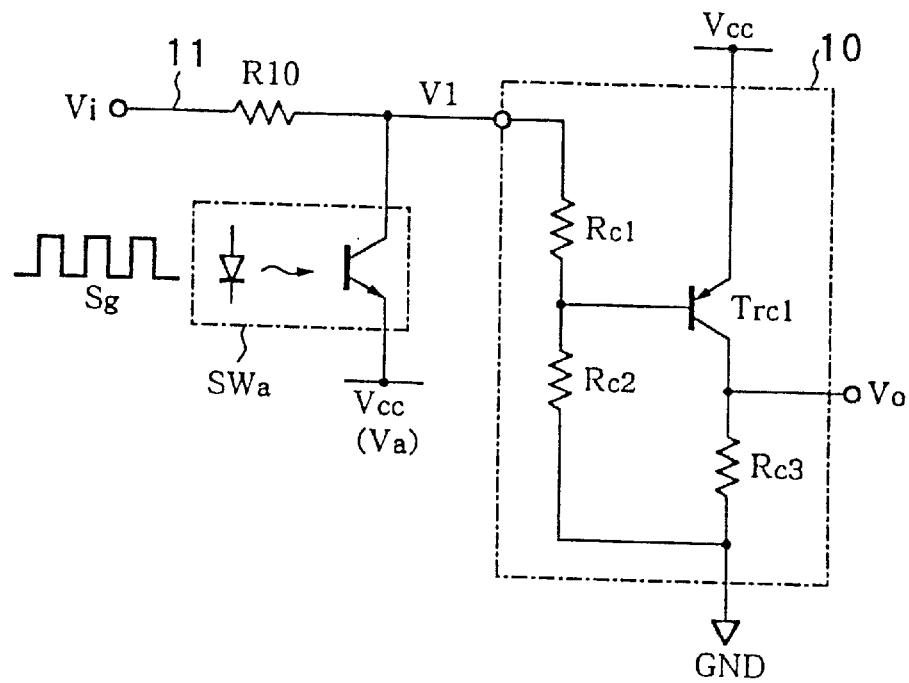
FIG. 7 is a specific circuit diagram of the first embodiment of FIG. 1.
Figure 8:
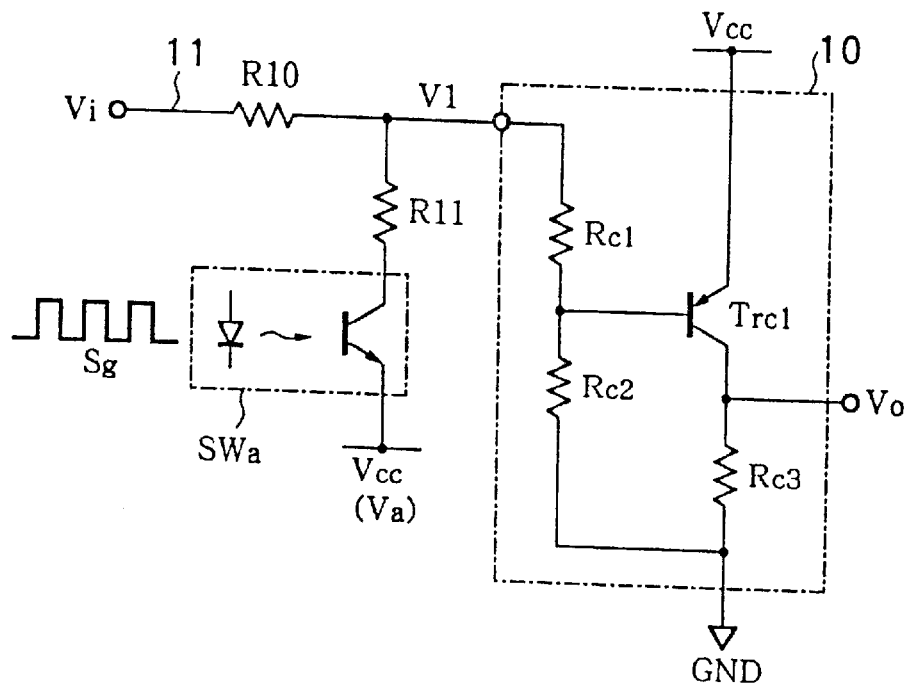
FIG. 8 is a specific circuit diagram of the third embodiment of FIG. 3.

FIG. 7 and FIG. 8 show respective specific circuit constructions for a threshold value operation circuit where the circuit of FIG. 5(A) is used for the switch SWa, and the comparator of FIG. 6(B) is used for the level detection circuit 10.

FIG. 7 is an example applicable to a threshold value operation circuit of the construction of FIG. 1, and FIG. 8 is an example applicable to a threshold value operation circuit of the construction of FIG. 3. Here with the circuits of FIG. 7 and FIG. 8, the voltage Va supplied to the other terminal of the switch SWa serves as the power source voltage Vcc.

Since the operation of the circuits of FIG. 7 and FIG. 8 is the same as for the previous descriptions, except that the voltage Va is replaced by the power source voltage Vcc, description is here omitted.

With the above respective embodiments, the description has been for the case where the input signal Vi, which is the subject of the level detection, is a direct current. However the input signal subject to level detection, may be an AC signal.

Figure 9:
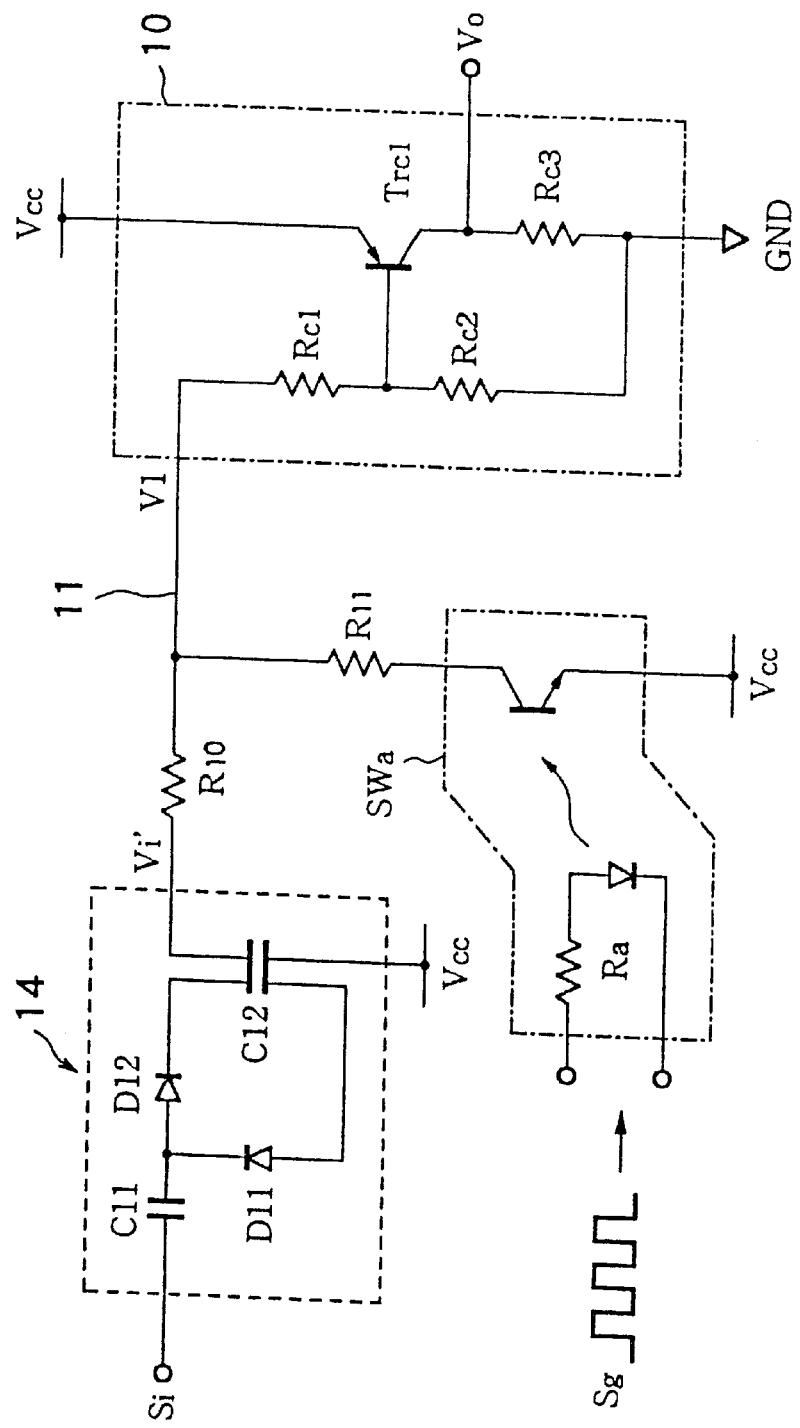
FIG. 9 is a diagram showing a specific circuit example for the case where an input signal is an AC signal.

To subject an AC signal Si to a threshold value operation, then as shown in FIG. 9, the AC signal subject to threshold value operation, may be rectified using for example a voltage doubler rectifying circuit 14 as a rectifying circuit, and converted to an DC signal which is then input to the various threshold value operation circuits described before in FIG. 1 through FIG. 4. FIG. 9 shows the case for where the threshold value operation circuit of FIG. 8 is used.

In FIG. 9, an output Vi' from the voltage doubler rectifying circuit 14 comprising two diodes D11 and D12 and two capacitors C11 and C12, becomes approximately equal to a DC level where an amplitude Vsi (peak to peak) of the AC signal Si is added to the power source voltage Vcc (that is Vi'≈Vsi+Vcc). When the DC output Vi' is within the range from the lower limit threshold value to the upper limit threshold value, an AC signal synchronous with the switching signal Sg from an external AC source, is produced in the output Vo.

Incidentally, in the case where a normal two terminal capacitor is used for the smoothing capacitor C12 of the voltage doubler rectifying circuit 14 rather than the four terminal capacitor shown in the figure, if a disconnection fault occurs in the two terminal capacitor, the AC signal Si is level converted to the power source level Vcc to appear as the output Vi'. In this case, even if the switch SWa is not switched, in the case where the AC signal appearing as the output Vi' spans the threshold value of the level detection circuit 10, an AC signal is produced in the output Vo from the level detection circuit 10. In order to avoid such a situation, a four terminal capacitor as shown in the figure may be used in the smoothing capacitor C12. In the case where a disconnection fault occurs in the four terminal capacitor C12, the output Vi' becomes approximately Vcc level, and since the lower limit threshold value of the level detection circuit 10 is made greater than this level, the output Vo from the level detection circuit 10 becomes a DC signal (logic value 0) irrespective of the switching operation of the switch SWa.

Figure 10:
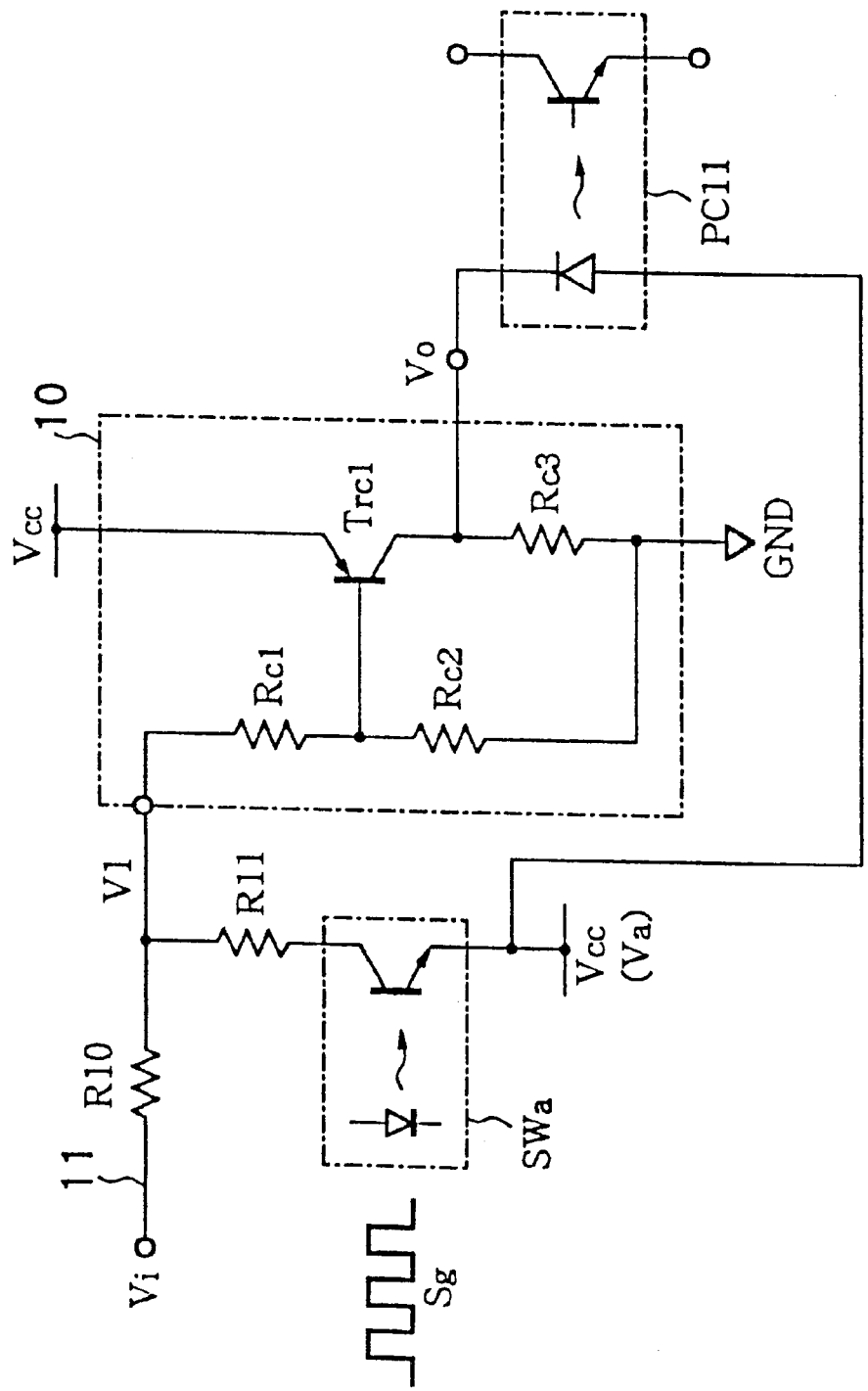
FIG. 10 is a diagram showing a circuit example for where an output from a level detection circuit is transmitted to an output circuit side via a photocoupler.

As shown in FIG. 10, the output Vo from the threshold value operation circuit may be supplied to a photocoupler PC11, and transmitted to the output circuit side via the photocoupler PC11.

With such a construction, it becomes possible to use respective independent power supplies for the output circuit side power supply and the threshold value operation circuit side power supply. Hence the threshold value operation circuit can be disposed at a position away from the output circuit. This not only increases the degree of freedom of the layout for the input signal generating source and the threshold value operation circuit, but also increases the degree of freedom for the layout of the output circuit.

Next is the description of a circuit example for performing level detection using only the current supplied from the input signal.

Figure 11:
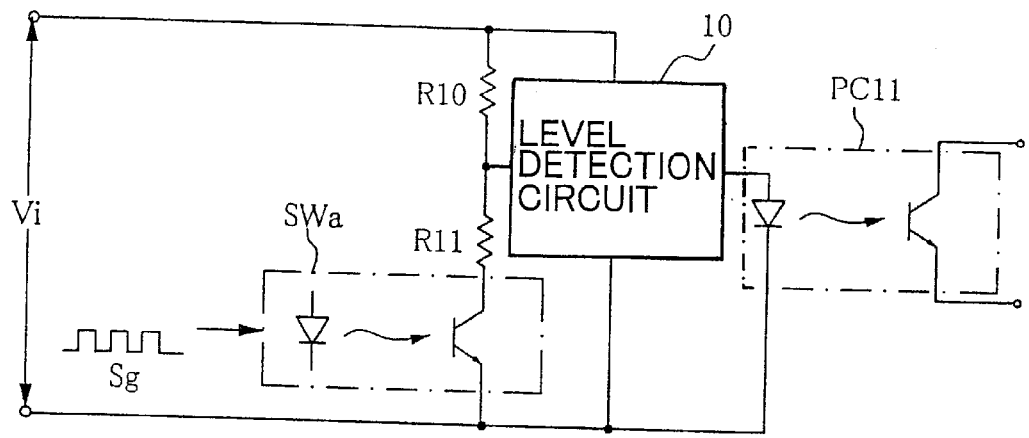
FIG. 11 is a circuit diagram of another embodiment of a threshold value operation circuit of the present invention.

In FIG. 11, this circuit is for level detecting an input signal Vi, with the input signal Vi as the power source for the level detection circuit 10. The input signal Vi is supplied as the power source for the level detection circuit 10, and on the other hand, this is modulated by a switching signal Sg from an external AC source using a switch SWa with a photocoupler, and the level detected by the level detection circuit 10. When the input signal Vi satisfies a set level, a light emitting diode of a photocoupler PC11 is excited in synchronous with the switching signal Sg so that an AC signal is generated via the photocoupler PC11. When the input signal Vi does not satisfy the set level, an AC signal is not generated from the photocoupler PC11. Here the level detection circuit 10 has the function of AC—AC conversion, and when the AC input level to the level detection circuit 10 satisfies the set condition, transmits an AC signal.

Next is a description of a circuit example using a zenner diode for level detecting.

Figure 12:
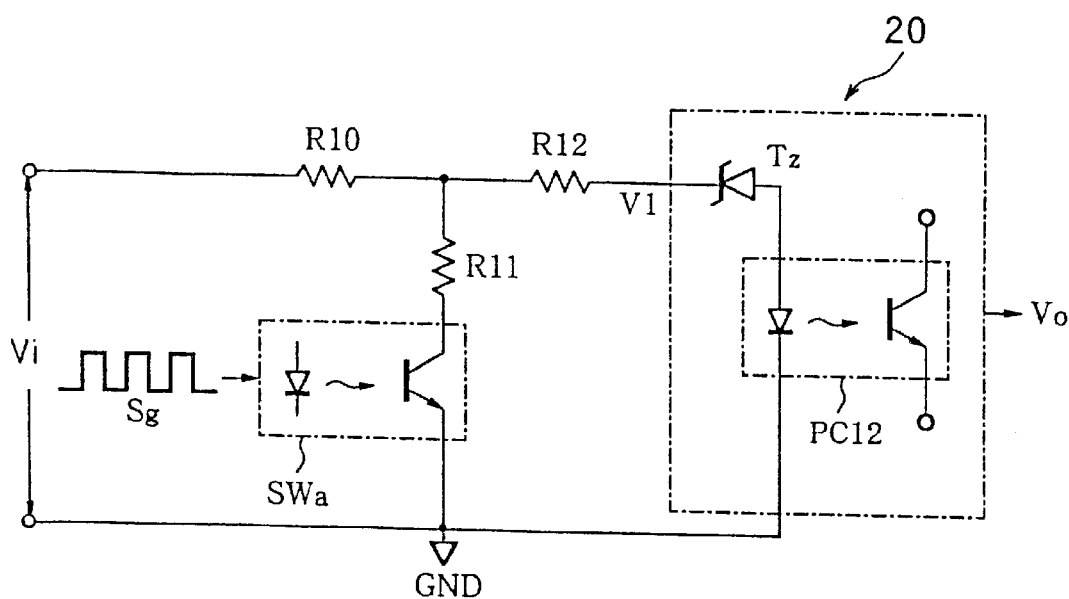
FIG. 12 is a structural diagram of a threshold value operation circuit of the present invention which uses a Zenner diode.

FIG. 12 shows a structural example of a threshold value operation circuit for performing an upper limit/lower limit threshold value operation using a Zenner diode. Components the same as for the abovementioned respective embodiments are denoted by the same reference symbols.

In FIG. 12, the photocoupler PC10 of FIG. 5(A) is used in a switch SWa. A level detection circuit 20 serving as a level detection device of this embodiment comprises a Zenner diode Tz and a photocoupler PC12. When the level of the modulation signal V1 is equal to or above the threshold value (in this case the Zenner voltage Vz) an AC output Vo is generated via the photocoupler PC12. A resistor R12 is a current decreasing resistor for controlling the input current to the Zenner diode Tz.

Next is a description of the operation.

This circuit is a threshold value operation circuit constructed such that when the input signal Vi is $Vz<Vi<Vz/\alpha$, the output Vo becomes an AC signal (logic value 1), while when $Vi \geq Vz/\alpha$ or $Vi \leq Vz$, the output Vo becomes a DC signal (logic value 0). Here Vz is the Zenner diode voltage, and $\alpha$ is $\alpha = r11/(r10+r11)$.

In the case where $Vz<Vi<Vz/\alpha$, when the switch SWa is switched on, the modulation signal V1 which is the input to the level detection circuit 20, becomes $V1=\alpha Vi$, and since $\alpha Vi<Vz$, the Zenner diode Tz goes off, and a current does not flow in the photocoupler PC12 which thus goes off. When the switch SWa goes off, V1=Vi results, and since Vi>Vz, the Zenner diode Tz conducts and a current flows in the photocoupler PC12 which thus comes on. Consequently, an AC output Vo is generated from the level detection circuit 20 in synchronous with the switching operation of the switch SWa due to a switching signal Sg from an external AC source.

In the case where $Vi \geq Vz/\alpha$, then even if the switch SWa is on, since $\alpha Vi \geq Vz$ the photocoupler PC12 remains on. Moreover, in the case where $Vi \leq Vz$, then even if the switch SWa is off, since $Vi \leq Vz$ the photocoupler PC12 remains off. Consequently with the output Vo from the level detection circuit 20, only when there is a threshold value range of $Vz<Vi<Vz/\alpha$, is an AC signal (logic value 1) generated in synchronous with the switching operation of the switch SWa. With this circuit, if the Zenner diode Tz has a short, the photocoupler PC12 remains in the on condition, irrespective of the on/off switching of the switch SWa.

As specific examples of the switches SWa for the abovementioned respective threshold value operation circuits, the photocoupler and the transistor of FIG. 5(A) and FIG. 5(B) have been shown. With the photocoupler however, the delay time for the on/off switching is generally large so that this is not suitable for high speed switching. On the other hand, while the transistor is suitable for high speed switching, considering the fail-safe characteristics, there are the following problems.

Figure 13:
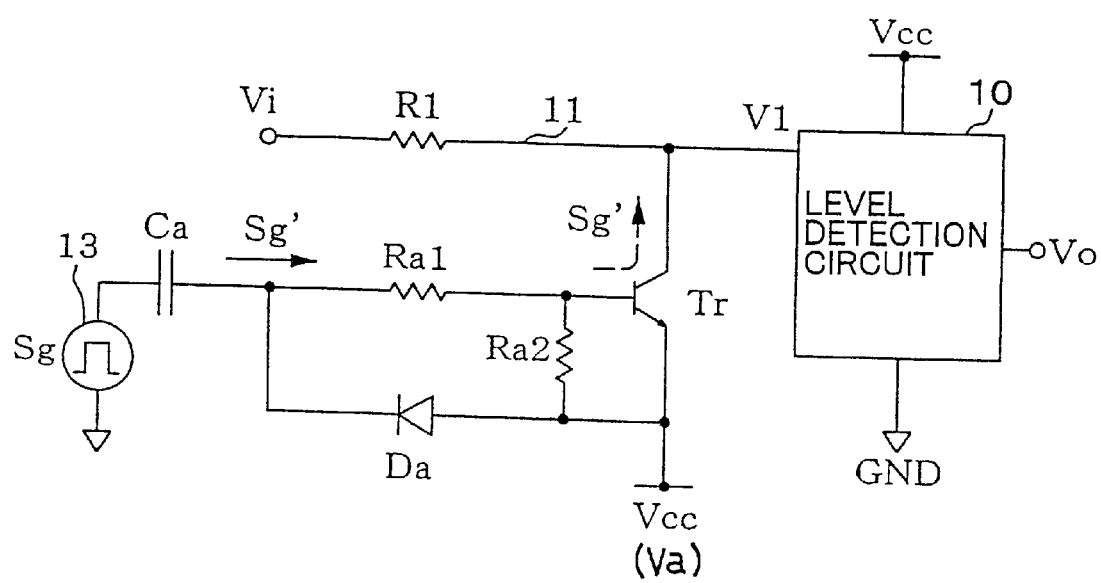
FIG. 13 is a diagram for explaining problem points for the case where a transistor is used in a switch.

A circuit where the construction of FIG. 5(B) is applied to the threshold value operation circuit of FIG. 1 is shown in FIG. 13, and these problems points are described. Here Va=Vcc.

Since the transistor Tr of FIG. 13 is an enhancement type, the on/off threshold value voltage (voltage between the base and emitter) of the transistor Tr is positive. The same applies also with a MOSFET. Consequently, a switching signal Sg of a level within the power source limits of amplitude 0–Vcc, output from the AC source 13 is level converted to a switching signal Sg' of a level outside of the power source limits of amplitude Vcc–2Vcc, by a capacitor Ca and then supplied to the base of the transistor Tr. The transistor Tr goes off when Sg'=Vcc, and comes on when Sg'=2Vcc. Here the threshold value Vt of the level detection circuit 10 is set to the range of Vcc<Vt<2Vcc. When with a fault of the transistor Tr, the switching signal Sg' is transmitted directly to the level detection circuit 10 as shown by the dotted line in the figure, there is the likelihood of an AC output Vo being generated from the level detection circuit 10 in synchronous with the switching signal Sg', regardless of the level of the input signal Vi. With the constant voltage Va set lower than the threshold value voltage Vt of the level detection circuit 10, if an enhancement type transistor is used in the switch SWa, there is the likelihood of this problem occurring.

A structural example of a high speed switching device to solve this problem is shown below.

Figure 14:
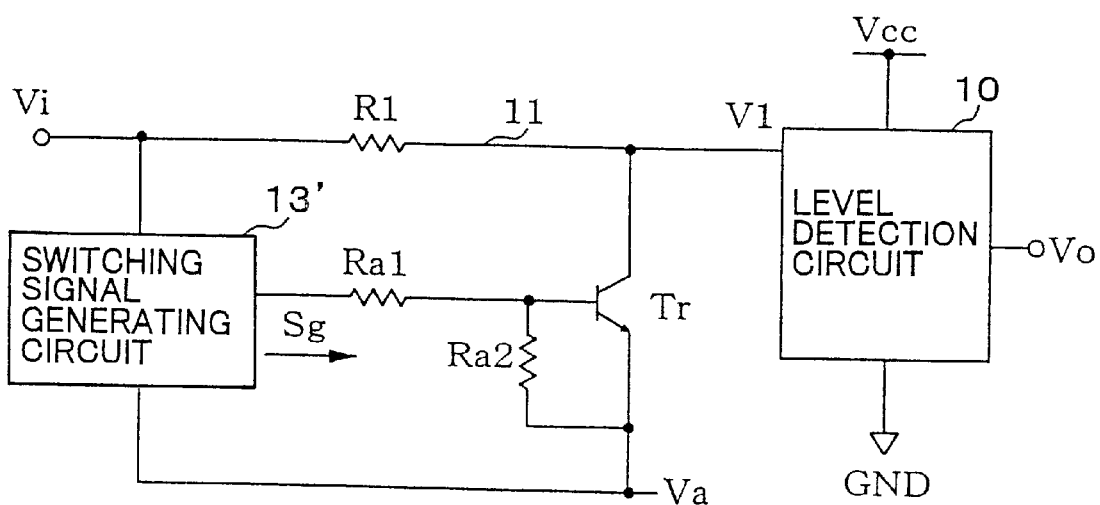
FIG. 14(A) and FIG. 14(B) are circuit diagrams for a construction which uses a signal with an amplitude of input signal - constant voltage as a switching signal, FIG. 14(A) being an example applied to the circuit of FIG. 1, and FIG. 14(B) being an example applied to the circuit of FIG. 3.
Figure 14:
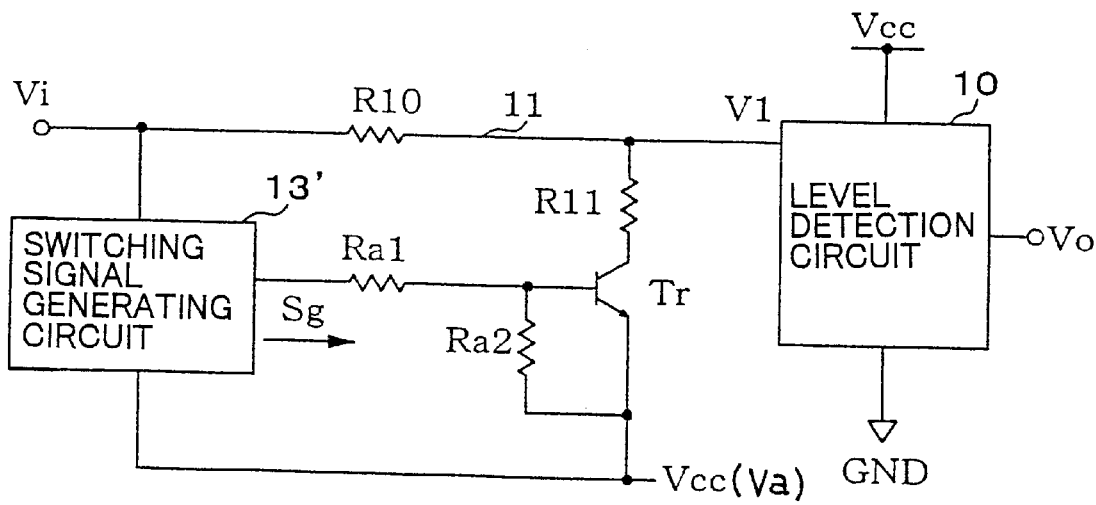

FIG. 14(A) and FIG. 14(B) are examples of constructions where the amplitude of the switching signal Sg generated from the AC source is set to a range between the input voltage Vi and a voltage Va of a constant voltage supply line, FIG. 14(A) being an example applied to the circuit of FIG. 1, and FIG. 14(B) being an example applied to the circuit of FIG. 3. In FIG. 14(B), the constant voltage Va=Vcc.

In FIG. 14(A) and FIG. 14(B), a switching signal generating circuit 13' serving as an AC source for generating the switching signal Sg, is constructed so as to supply input signals Vi and Va (Vcc in FIG. 14(B)) as the power source, and output a signal of an amplitude of the range Va (Vcc in FIG. 14(B))—Vi as the switching signal Sg.

With such a construction, the transistor Tr comes on when the switching signal Sg is Vi, and goes off when this is Va or Vcc, and the modulation signal Vi is input to the level detection circuit 10. Even if with a fault of the transistor Tr, the switching signal Sg is input directly to the level detection circuit 10, since the input signal Vi is only transmitted in each example of FIG. 14(A) and FIG. 14(B), then if the input signal Vi is lower than the threshold value voltage Vt, an AC output is not generated from the level detection circuit 10 so that there is no problem. Consequently, when the switch device is constructed with a transistor, it is possible to prevent the situation where due to a fault of the transistor the switching signal is input directly to the level detection circuit so that an AC signal of logic value 1 is generated from the level detection circuit by the switching signal, irrespective of the input signal.

As another structural example of a high speed switching device for solving the above problem, there is a construction where a signal which does not cross over the threshold value Vt of the level detection circuit 10 is used for the switching signal Sg.

Figure 15:
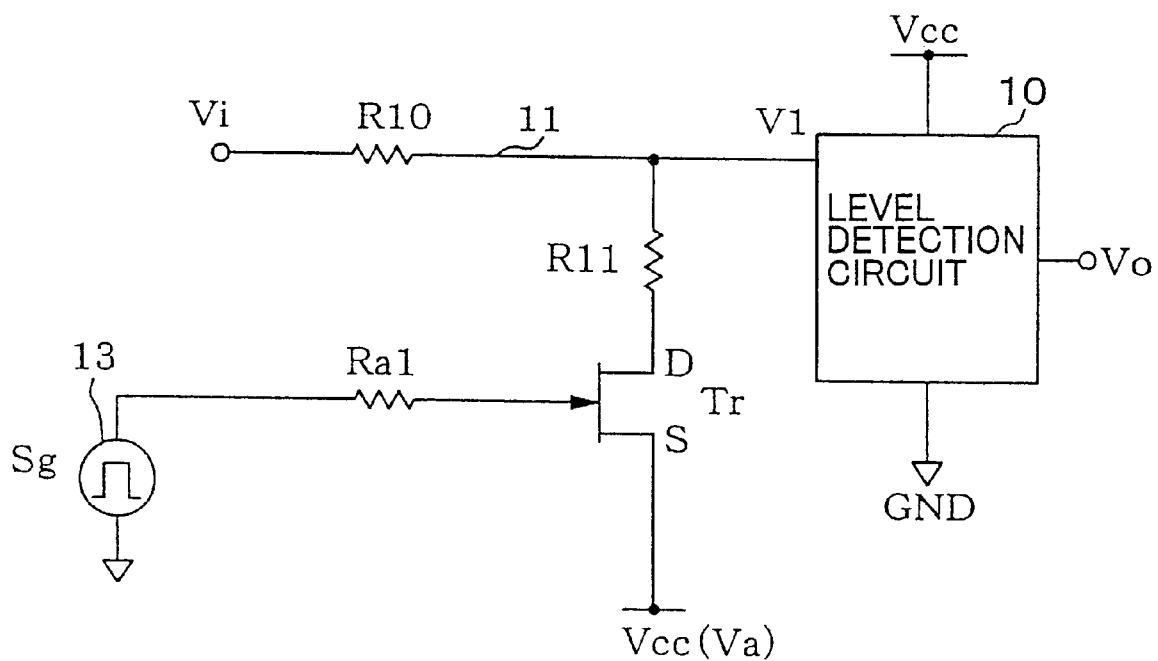
FIG. 15 is a circuit diagram of a construction which uses a depletion type transistor.

FIG. 15 shows an example where this construction is applied to the circuit of FIG. 3. Here Va=Vcc.

In FIG. 15, an n-type depletion type JFET (junction FET) Tr is used in the switch SWa, with a source connected to a constant voltage line and a drain connected to an input signal line 11. With the n-type depletion type transistor, the on/off threshold value voltage (the voltage Vtgs between the gate and source with an FET) is negative. Consequently, with this circuit, when the switching signal Sg is larger than Vtgs (<Vcc), the transistor Tr comes on, while when the switching signal Sg is smaller than Vtgs (<Vcc), the transistor Tr goes off. Therefore a signal having for example the amplitude of GND-Vcc may be used as the switching signal Sg.

That is to say, it is possible for Sg≦Va, and if the threshold value voltage Vt of the level detection circuit 10 has the relation Vt>Va, the switching signal Sg does not cross over the threshold value voltage Vt, so that even if a fault occurs where the switching signal Sg is input directly to the level detection circuit 10, an AC output Vo is not generated from the level detection circuit 10. Moreover, with the construction of FIG. 15, there is the advantage that the circuit for level converting the switching signal Sg to the signal Sg' as in FIG. 5(B) can be omitted.

In the case where there is a set relation of Vt<Va, if a p-type depletion type transistor is used, since the on/off threshold value voltage of the transistor is positive, then Va≦Sg is possible. Similarly it is possible to have the switching signal Sg not crossing over the threshold value voltage Vt. Even if a depletion type MOSFET is used, the construction can be the same.

As a device for modulating the input signal using the switching signal Sg, a photocoupler or a transistor switch device has been shown. However a buffer circuit may also be used. A structural example using buffer circuit is shown in FIG. 16.

Figure 16:
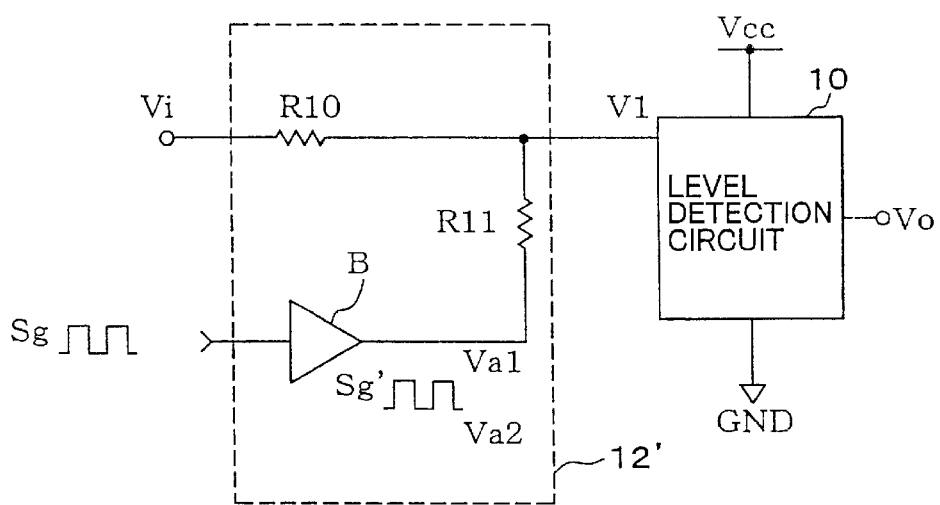
FIG. 16 is a circuit diagram of a construction which uses a buffer circuit in a modulation device.

FIG. 16 is an example applied to the circuit of FIG. 3.

In FIG. 16, with a modulation circuit 12' of this embodiment, a buffer circuit B is provided instead of the switch Swa in the modulation circuit 12 of FIG. 3. The buffer circuit B takes the input of the switching signal Sg and outputs a switching signal Sg' of an amplitude of Va1–Va2 (Va1>Va2) and supplies this to a resistor R11.

Next is a description of the operation.

With the input V1 to the level detection circuit 10, when Sg'=Va1, this gives V1 (Va1)=(Vi/r10+Va1/r11)×(r10∥r11∥Rc), while when Sg'=Va2, this gives V1 (Va2)=(Vi/r10+Va2/r11)×(r10∥r11∥Rc). Here r10∥r11∥Rc=1/(1/r10+1/r11+1Rc). Since Va1>Va2, then V1 (Va1)>V1 (Va2), and when with respect to the threshold value voltage Vt of the level detection circuit 10, there is the relation Vt>V1 (Va1) or V1 (Va2)>Vt, the output Vo from the level detection circuit 10 is fixed at a constant voltage. Consequently, with this circuit, when V1 (Va1)>Vt>V1 (Va2), that is, only in the range of r10×(Vt/(r10μr11∥Rc)−Va1/r11)<Vi<r10<r10×(Vt/(r10∥r11∥Rc)−Va2/r11), is an AC signal synchronous with the switching signal Sg' generated in the output Vo from the level detection circuit 10. That is to say, the circuit of FIG. 16 has a lower limit threshold value VtiL=r10×(Vt/(r10∥r11∥Rc)−Va1/r11), and an upper limit threshold value VtiH=r10×(Vt/(r10∥r11∥Rc)−Va2/r11), with respect to the input signal Vi.

Here if Rc>>r10, r11, and moreover Vi>Vcc, Va1=Vcc, Va2=0 V (GND), then the lower limit threshold value is VtiL=(1+r10/r11)×Vt−Vcc×r10/r11, and the upper limit threshold value is VtiH=(1+r10/r11)×Vt. Here the output impedance of the buffer circuit B is made zero.

Needless to say, it does not matter if the construction is such that the switching signal Sg is supplied as is to the resistor R11, without conversion to the switching signal Sg'.

With the construction where the switching signal Sg is supplied as is to the resistor R11, a construction is also considered where the switching signal is made proportional to the input signal Vi. With FIG. 17, there is a signal of an amplitude of KVi–Va2 serving as the switching signal Sg', being the output from the buffer circuit B. Here KVi (K is a proportional constant) is proportional to the input signal Vi, with KVi>Va2.

The operation is the same as with FIG. 16, with Va1 in the circuit of FIG. 16 replaced by KVi.

That is to say, with the modulation input V1 to the level detection circuit 10, when Sg'=KVi, V1 (KVi)=(Vi/r10+KVi/r11)×(r10∥r11∥Rc), while when Sg'=Va2, this gives V1 (Va2)=(Vi/r10+Va2/r11)×(r10∥r11∥Rc). Since KVi>Va2, then V1 (KVi)>V1 (Va2), and when with respect to the threshold value voltage Vt of the level detection circuit 10, there is the relation Vt>V1 (KVi) or V1 (Va2)>Vt, the output Vo from the level detection circuit 10 is fixed at a constant voltage. With this circuit, when V1 (KVi)>Vt>V1 (Va2), that is, only in the range of Vt/((1/r10+k/r11)×(r10∥r11∥Rc)) <Vi<r10×(Vt/(r10∥r11∥Rc)−Va2/r11), is an AC signal synchronous with the switching signal Sg' generated in the output Vo from the level detection circuit 10. That is to say, this has a lower limit threshold value VtiL=Vt/((1/r10+k/r11)×(r10∥r11∥Rc)), and an upper limit threshold VtiH=r10× (Vt/(r10∥r11∥Rc)−Va2/r11), with respect to the input signal Vi.

If Rc>>r10, r11, and Vi, Vt>Vcc, k=1, Va2=Vcc, then the lower limit threshold value is VtiL=Vt, and the upper limit threshold value is VtiH=(1+r10/r11)×Vt−Vcc×r10/r11. Here the output impedance of the buffer circuit B is made zero.

Figure 17:
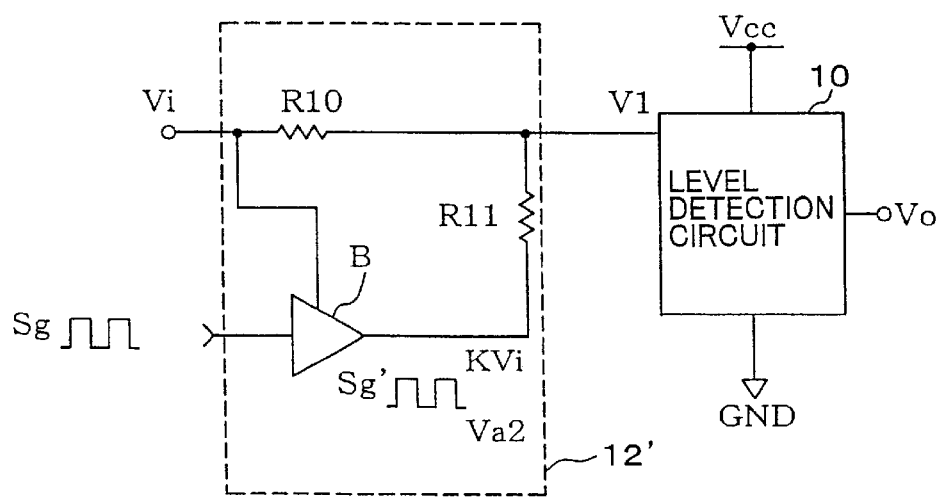
FIG. 17 is another circuit diagram of a construction which uses a buffer circuit in a modulation device.

A description is now given for the case where in the circuit of FIG. 17, r11=0, that is for the case with no resistor R11, applied to the circuit of FIG. 1.

The input V1 to the level detection circuit 10 is KVi when Sg'=KVi, and Va2 when Sg'=Va2. If Vt>Va2, then when Vt>KVi, the output Vo from the level detection circuit 10 is fixed at a constant voltage. Consequently, when KVi>Vt, that is, only in the range of Vi>Vt/k is an AC signal synchronous with the switching signal Sg' generated in the output Vo from the level detection circuit 10. That is to say, this has a lower limit threshold value VtiL=Vt/k with respect to the input signal Vi. On the other hand, if Va2>Vt, then when KVi>Vt, the output Vo from the level detection circuit 10 is fixed at a constant voltage. Consequently, when Vt>KVi, that is, only in the range of Vt/k>Vi is an AC signal synchronous with the switching signal Sg' generated in the output Vo from the level detection circuit 10. That is to say, this has an upper limit threshold value VtiH=Vt/k with respect to the input signal Vi.

In this case, as can be seen from the above equation, the respective threshold values are unrelated to the resistor R10, and hence the resistor R10 can be removed.

FIG. 18(A) and FIG. 18(B) show another embodiment of a threshold value operation circuit corresponding to a third aspect of the present invention. The construction is such that after an input signal Vi subject to threshold value operation, is level detected by a Zenner diode Tz, this is modulated by a modulation device.

In FIG. 18(A) the construction is such that the Zenner diode Tz serving as a level detection device, is inserted in an input line 11 between an input terminal for the input signal Vi and a first resistor R10. Other construction is the same as that of FIG. 12.

With the circuit of this embodiment, when the input signal Vi is $VL_{ED}+Vz<Vi<VL_{ED}/\alpha+Vz$, the output Vo becomes an AC signal (logic value 1), while when this is the Vi>$VL_{ED}/\alpha+Vz$ or Vi<$VL_{ED}+Vz$, the output Vo becomes a DC signal (logic value 0). Here Vz is the Zenner voltage of the Zenner diode Tz, $VL_{ED}$ is the falling voltage of the light emitting diode of a photocoupler PC12 serving as the AC signal generating device, and α=r11/(r10+r11).

In the case where $VL_{ED}+Vz<VL_{ED}/\alpha+Vz$, then when the switch SWa is on, the modulation signal V1 input to the light emitting diode of the photocoupler PC12 becomes V1=α (Vi−Vz), and since α (Vi−Vz)<$VL_{ED}$, a current does not flow in the photocoupler PC12 which thus goes off. If the switch SWa is off, then V1=Vi−Vz, and since Vi−Vz>$VL_{ED}$, a current flows in the photocoupler PC12 which thus comes on.

On the other hand, in the case where Vi≧$VL_{ED}/\alpha+Vz$, then even if the switch SWa is on, since α (Vi−Vz)≧$VL_{ED}$, the photocoupler PC12 remains on. Moreover, in the case where Vi≦$VL_{ED}+Vz$, then even if the switch SWa is off, since Vi−Vz≦$VL_{ED}$ the photocoupler PC12 remains off.

Consequently, only when the output Vo from the photocoupler PC12 is within a threshold value range of $VL_{ED}+Vz<Vi<VL_{ED}/\alpha+Vz$ is an AC signal (logic value 1) generated in synchronous with the switching operation of the switch SWa. With this circuit also, if the Zenner diode Tz is short-circuited, the photocoupler PC12 remains in the on condition irrespective of the on/off switching of the switch SWa.

FIG. 18(B) is an example of where a transistor Tr12, as surrounded by the dotted line in the figure, is used instead of the photocoupler PC12, as the AC signal generating device. In this case, if the voltage between the base and emitter when the transistor Tr12 is on is made Vbe, and the falling voltage $VL_{ED}$ of the light emitting diode of the photocoupler PC12 is replaced with Vbe, this constitutes the same arrangement as the circuit of FIG. 18(A) (provided that the current passed by the resistor R13 can be ignored).

The following description is given for the case of the circuit construction using the photocoupler PC12. However also in the case where the transistor Tr12 is used, if in the circuits of FIG. 19 through FIG. 21, $VL_{ED}$ is replaced with Vbe, then this constitutes the same arrangement as the circuit of FIG. 18(A).

Figure 18:
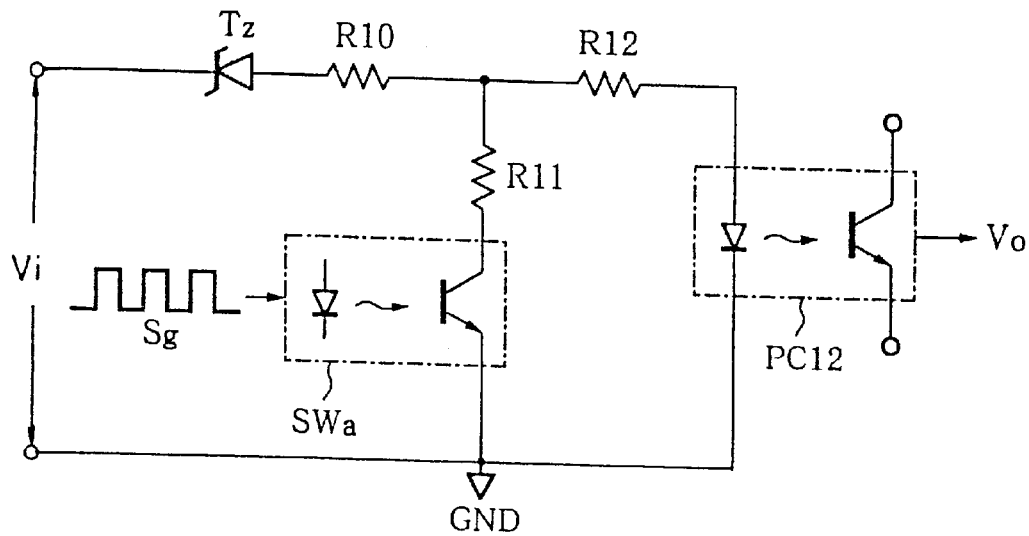
FIG. 18(A) and FIG. 18(B) are another structural diagrams of a threshold value operation circuit of the present invention which uses a Zenner diode, FIG. 18(A) being an example of a photocoupler applied to the generation of an AC output, and FIG. 18(B) being an example of a transistor applied to the generation of an AC output.
Figure 18:
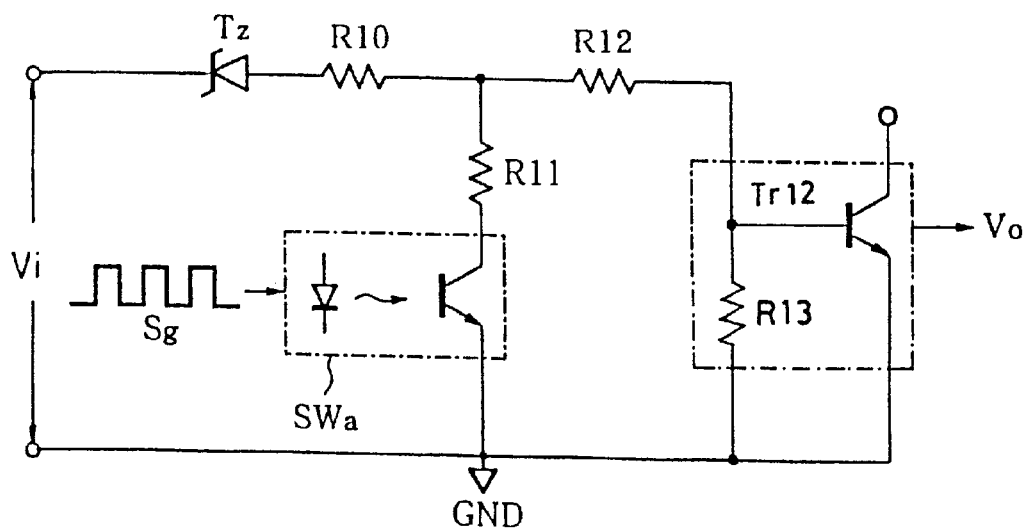

In the case of the circuits of FIG. 12 and FIG. 18, also when the Zenner diode Tz is short-circuited, if the input signal Vi is within the range of αVi<$VL_{ED}$, and Vi>$VL_{ED}$, there is the problem that the photocoupler PC 12 switches on/off following the switching operation of the switch SWa.

Figure 19:
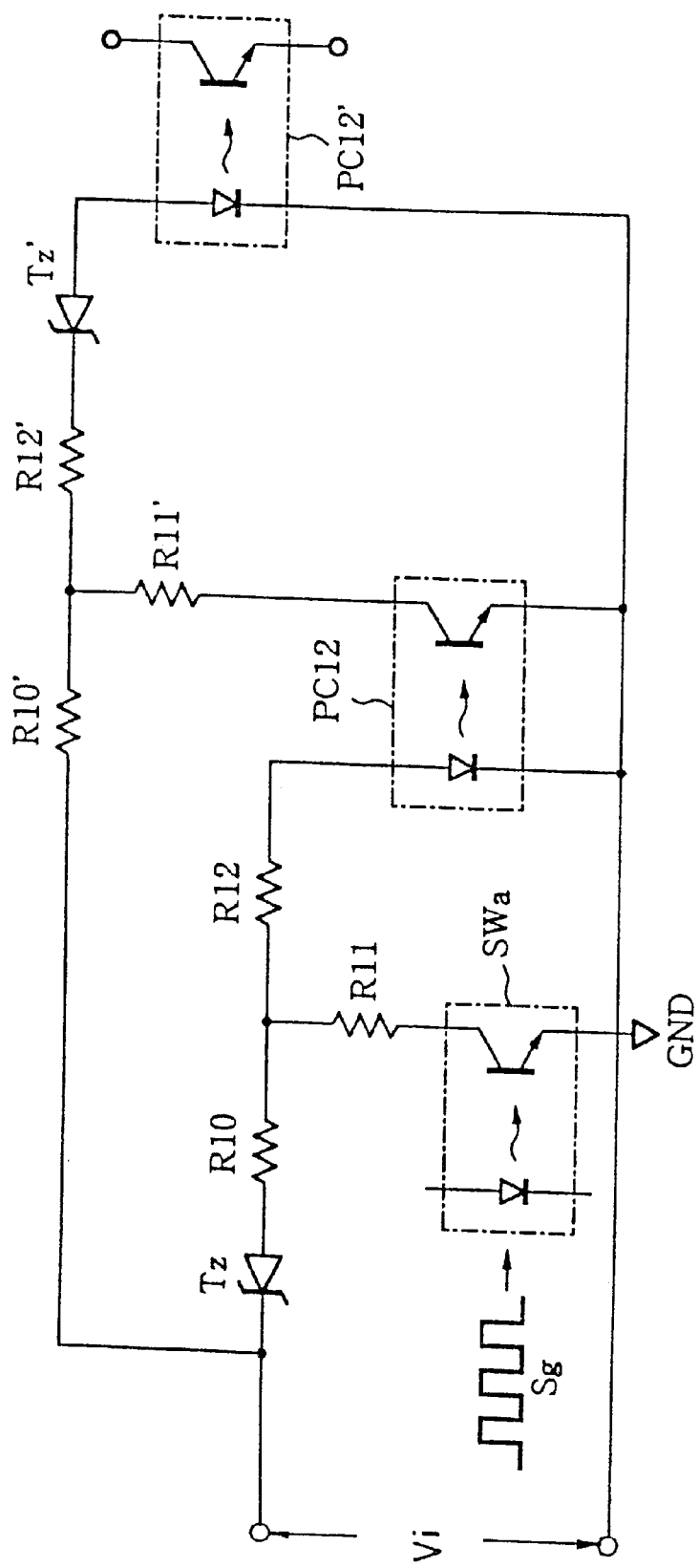
FIG. 19 is a circuit diagram with the threshold value operation circuits of FIG. 12 and FIG. 18 combined.

FIG. 19 shows a structural example of a threshold value operation circuit corresponding to claim 21 for solving the above problem.

In FIG. 19, this threshold value operation circuit is a combination of the circuit of FIG. 12 and the circuit of FIG. 18. That is to say, the construction is such that the photocoupler PC12 of the threshold value operation circuit of FIG. 18 is used as the switch SWa of FIG. 12. Here in the figure, R10', R11', R12' correspond to the respective resistors R10, R11, R12 of FIG. 12, and Tz', PC12' respectively correspond to the Zenner diode Tz and the photocoupler PC12 in the level detection circuit 20 of FIG. 12. Consequently, the Zenner diodes Tz, Tz' correspond to the first and second Zenner diodes, the switch SWa corresponds to the switching device, the photocoupler PC12 corresponds to the first photocoupler, and the photocoupler PC12' corresponds to the second photocoupler.

With such a construction, the input signal Vi subject to threshold value operation, is subjected to a threshold value operation by the first Zenner diode Tz, and if this is the set level, an AC signal is generated from the first photocoupler PC12. Then, with the AC signal from the first photocoupler PC12 as a switching signal, the input signal Vi is modulated and input to the second Zenner diode Tz' and level detected. If the level detection result is such that the input modulation signal is the set level, an AC signal (logic value 1) is generated from the second photocoupler PC12'. That is to say, the lower limit threshold value is set by the first Zenner diode Tz, the upper limit threshold value is set by the second Zenner diode Tz', and the upper limit threshold value operation is executed with the output result of the lower limit threshold value operation as the modulation signal.

With such a construction, since the lower limit and upper limit of the respective threshold values can be independently set, then in the case where the Zenner diode Tz or Tz' is short-circuited, generation of an AC signal (logic value 1) from the second photocoupler PC12 can be prevented.

In FIG. 19, in the case where an input signal level exists between the lower limit threshold value Vz and the upper limit threshold value Vz'/α' (here α'=r'11/(r10'+r11')), the passing current of the light emitting diode of the photocoupler PC12' is approximately (Vz'−Vz)/r12' at a minimum. In the case where the Zenner diodes Tz and Tz' both short, the range of the input level where a possibility exists for the occurrence of an AC signal in the output of the photocoupler PC12' is:

$$VL_{ED} < Vi < \min(VL_{ED}/\alpha, VL_{ED}\alpha') \quad (1)$$

where α=r11/(r10+r11).

At this time, the passing current of the light emitting diode of the photocoupler PC12' is $(VL_{ED}/r12') \cdot (1-\alpha)/\alpha$, or $(VL_{ED}/r12') \cdot (1-\alpha')/\alpha$.

If Vz'−Vz is set in sufficiently large proportion to $VL_{ED} \times \min((1-\alpha')/\alpha, (1-\alpha)/\alpha)$, then even in the case where the Zenner diodes Tz and Tz' both short and the input voltage is kept within the narrow range defined by the above equation (1), the generation of an output current of the photocoupler PC12' can be suppressed.

Next an application example for the threshold value operation circuit of the present invention is described.

Figure 20:
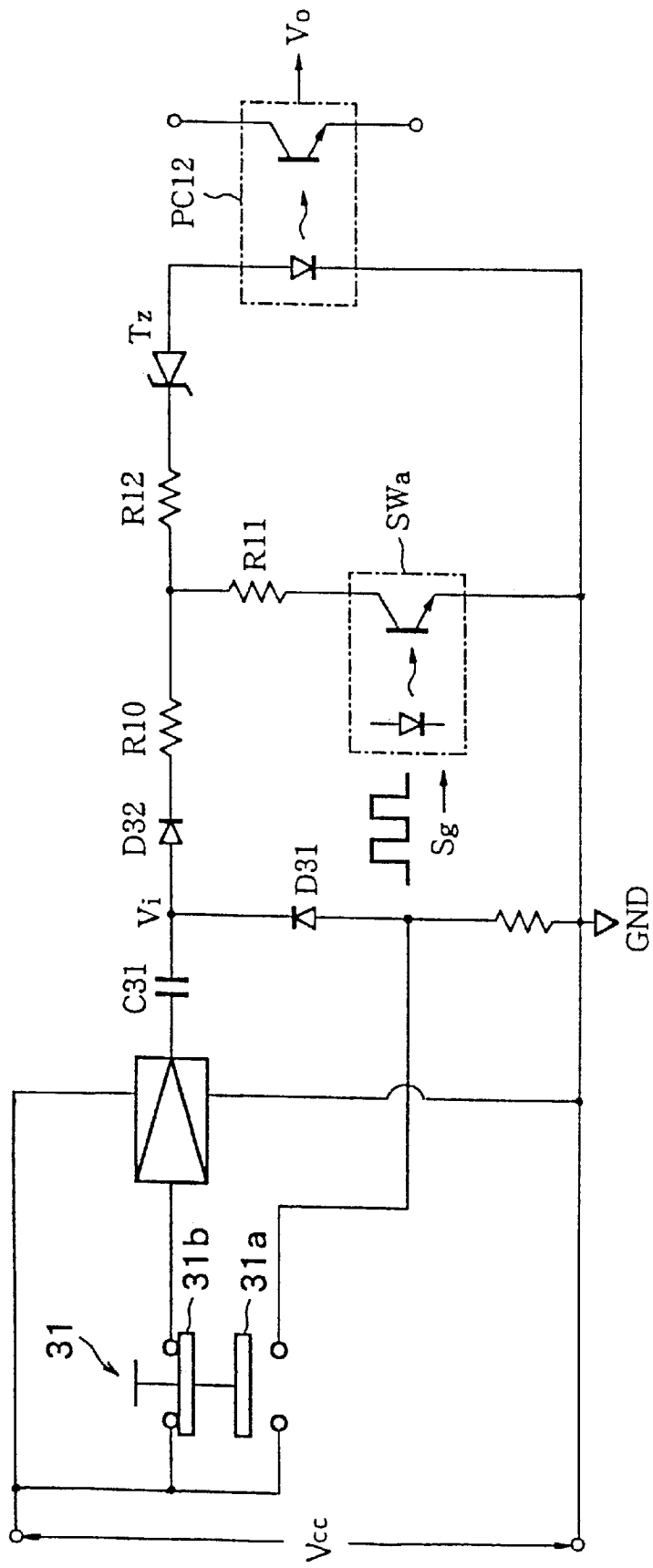
FIG. 20 is a diagram showing an embodiment of a start signal generating circuit to which the threshold value operation circuit of the present invention is applied.

FIG. 20 shows an example of a start signal generating circuit for a machine, having a level detection function which uses the above mentioned threshold value operation circuit.

In FIG. 20, with this circuit, the construction is such that a start signal is generated while verifying the normalcy of a start switch 31 having a first contact point 31a and a second contact point 31b with a complementary relationship to each other. That is to say, a back-check as to whether or not the second contact point 31b comes on after the first contact point 31a comes on is performed, and when the second contact point 31b comes on, the start signal is generated.

When the start switch 31 is pressed so that the first contact point 31a comes on, a capacitor C31 is charged via a diode D31. After this, when the start switch 31 is returned and the second contact point 31b comes on, the capacitor C31 discharges. The construction is such that this discharge signal is input to the threshold value operation circuit of the present invention as the input signal Vi subject to threshold value operation, and subjected to threshold value operation, and only when this is the set level, is an AC (logic value 1) start signal Vo generated from the photocoupler PC12 of the threshold value operation circuit. With the present embodiment, the threshold value operation circuit using the Zenner diode Tz shown FIG. 12 is applied, however needless to say other threshold value operation circuits are suitable.

With the present embodiment, the input voltage Vi at the time of discharge is a level of 2Vcc, while at the time of charging this is Vcc. Consequently, so that an AC signal is generated when Vi=2Vcc, and an AC signal is not generated when Vi=Vcc, then α(=r11/(r10+r11)) and the Zenner voltage Vz are set so as to satisfy Vcc<Vz<2Vcc, and 2Vcc/α<Vz.

The charge stored in the capacitor C31 is discharged by the diode D32 after the first contact point 31a goes off.

In FIG. 20, in the case where the Zenner diode Tz is short-circuited, then in the course of discharging the charge which has been charged to the capacitor C31, there is a period where the signal level voltage divided by the resistors R10 and R11 is within a range $VL_{ED}$ and $VL_{ED}/\alpha$ (α=r11/(r10+r11)). However the generation time for this is extremely short compared to the case where the Zenner diode Tz is normal.

Figure 21:
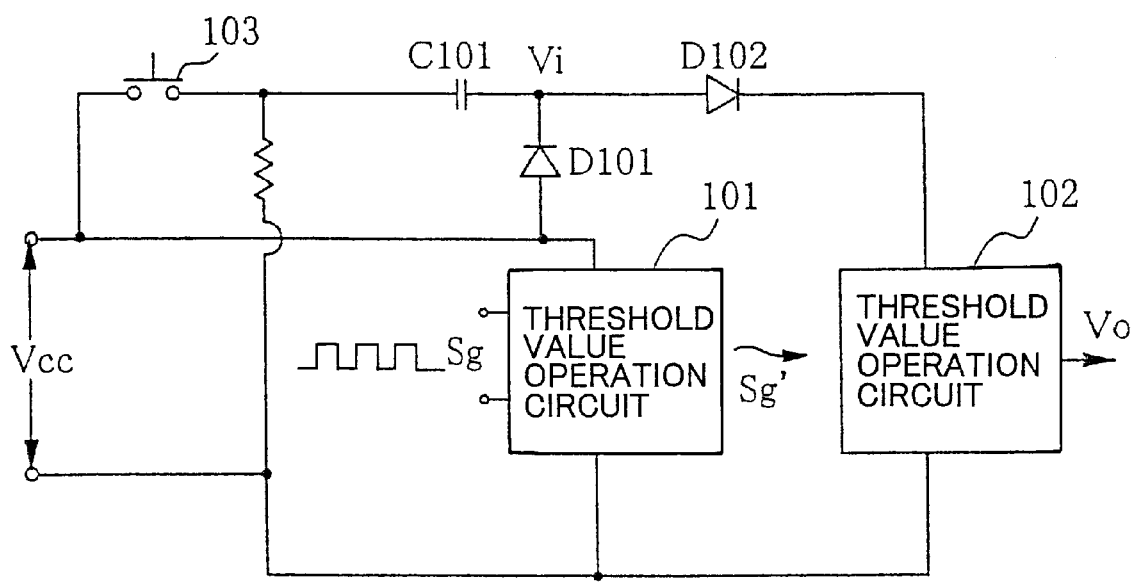
FIG. 21 is a diagram showing another structural example of a start signal generating circuit.

FIG. 21 shows another example of this type of start signal generating circuit for a machine.

The circuit of FIG. 21 is one where the threshold value operation circuit of FIG. 19 is applied.

In FIG. 21, the threshold value operation circuits 101 and 102 are those shown in FIG. 19. The threshold value operation circuit 101 performs a threshold value operation with respect to the power source voltage Vcc, with the power source voltage Vcc as the input signal. The output therefrom is generated as an AC switching signal Sg' for the threshold value operation circuit 102. The threshold value operation circuit 102, with the signal Vi generated when an operation button 103 is switched on, as the input signal subject to threshold value operation, performs a threshold value operation with respect to this signal Vi and generates an output signal Vo as the final start signal. A capacitor C101, and diodes D101, D102 correspond to the capacitor C31 and the diodes D31, D32 in FIG. 20.

With such a construction, if the power source voltage Vcc satisfies a set level, the threshold value operation circuit 101 generates an AC output synchronized with an external AC switching signal Sg, and inputs the AC switching signal Sg' to the threshold value operation circuit 102. Then, if the signal Vi when the operation button 103 is switched on satisfies the set level, an AC output signal Vo synchronized with the switching signal Sg' is generated from the threshold value operation circuit 102. The level of the signal Vi increases from Vcc to 2Vcc when the operation button 103 is pressed on. The lower limit threshold value of the threshold value operation circuit 102 is set between Vcc and 2Vcc.

Here if the power source voltage Vcc itself increases, the level of the signal Vi exceeds the threshold value of the threshold value operation circuit 102. However since in the case where the increased power source voltage Vcc level does not satisfy the set level of the threshold value operation circuit 101, the switching signal Sg' is not generated from the threshold value operation circuit 101, an AC output signal Vo is not generated from the threshold value operation circuit 102. Consequently, only when the power source voltage Vcc is at a normal level is the output signal Vo generated.

Next is a description of an AND gate circuit which uses the threshold value operation circuit of the present invention.

Figure 22:
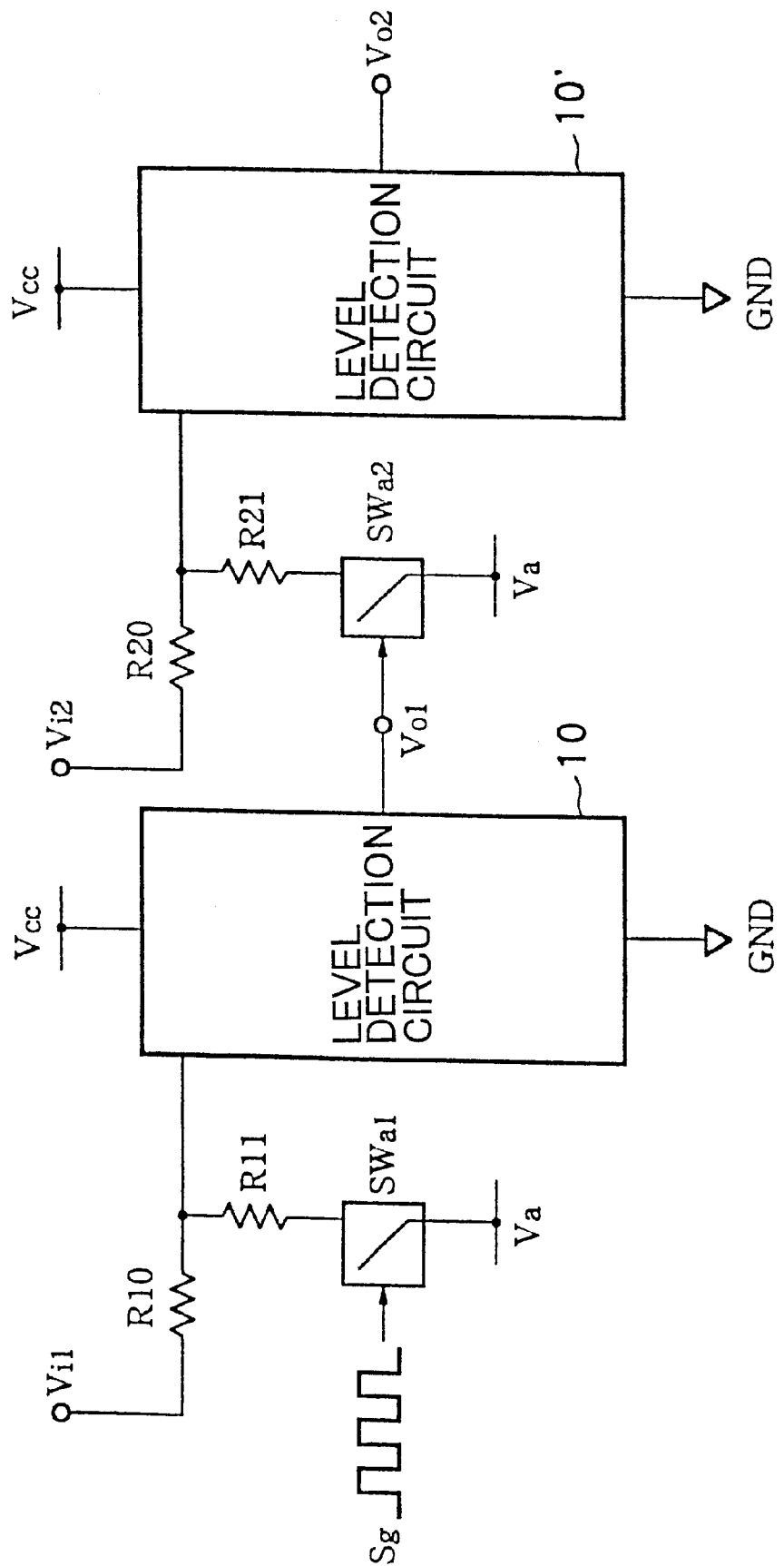
FIG. 22 is a structural diagram of an embodiment of an AND gate circuit of the present invention.

FIG. 22 shows a structural example of an AND gate circuit which uses the threshold value operation circuit of FIG. 3. Needless to say, an AND gate circuit can be constructed similarly from the other threshold value operation circuits.

In FIG. 22, the AND gate circuit of this embodiment comprises a first threshold value operation circuit comprising resistors R10, R11, a switch SWa1, and a level detection circuit 10, and a second threshold value operation circuit comprising resistances R20, R21, a switch Swa2, and a level detection circuit 10'. The construction is such that an output Vo from the first threshold value operation circuit 10 is made a switching signal for the switch SWa2 of the second threshold value operation circuit 10'. With this AND gate circuit, when the DC input signals Vi1 and Vi2 are both within respectively predetermined levels, an AC signal (corresponding to logic value 1) is generated as an output Vo2 from the second threshold value operation circuit.

Hereunder is a description of the operation.

The switch SWa1 of the first threshold value operation circuit switches in synchronous with a switching signal Sg from a separately provided AC source.

When the input Vi1 is within a range from a lower limit threshold value Vt1L to an upper limit threshold value Vt1H determined for example by resistors R10, R11, Va and a threshold value Vt1 of the level detection circuit 10, an AC signal (corresponding to logic value 1) is generated as the output Vo1 from the first threshold value operation circuit. This AC output signal Vo1 is supplied to the switch SWa2 of the next stage second threshold value operation circuit, and the switch SWa2 switches in synchronous with the signal Vo1. When the input signal Vi2 is within a range from a lower limit threshold value Vt2L to an upper limit threshold value Vt2H determined for example by resistors R20, R21, Va and a threshold value Vt2 of the level detection circuit 10', an AC signal (corresponding logic value 1) is generated as the output Vo2.

If for example the input Vi1 is less than the lower limit threshold value Vt1L or greater than the upper limit threshold value Vt1H, the output Vo1 from the first threshold value operation circuit becomes a DC signal (corresponding to logic value 0), and an AC signal is not generated. Consequently, the switch SWa2 of the second threshold value operation circuit does not switch, and is fixed in the on condition or the off condition. Therefore, even if the input signal Vi2 is within the threshold value range, the output Vo2 from the second threshold value operation circuit becomes a DC signal (that is, logic value 0) and an AC signal is not generated. Moreover, also when the input signal Vi1 is within the threshold value range but the input signal Vi2 is outside of the threshold value range, an AC signal is not generated in the output Vo2 of the second threshold value operation circuit.

In this way, the circuit of FIG. 22 is an AND gate circuit in that only when the input signals Vi1 and Vi2 are both within their respectively determined threshold value ranges (i.e., both logic value 1) is an AC signal output (a logic value 1 generated).

If the construction is such that a threshold value operation circuit is further connected in cascade so that a switch SWa of a next stage threshold value operation circuit is driven by an output Vo from a previous stage threshold value operation circuit, then a multiple input AND gate circuit can be constructed, enabling multiple input AND operations (logical product operations) to be performed.

Figure 23:
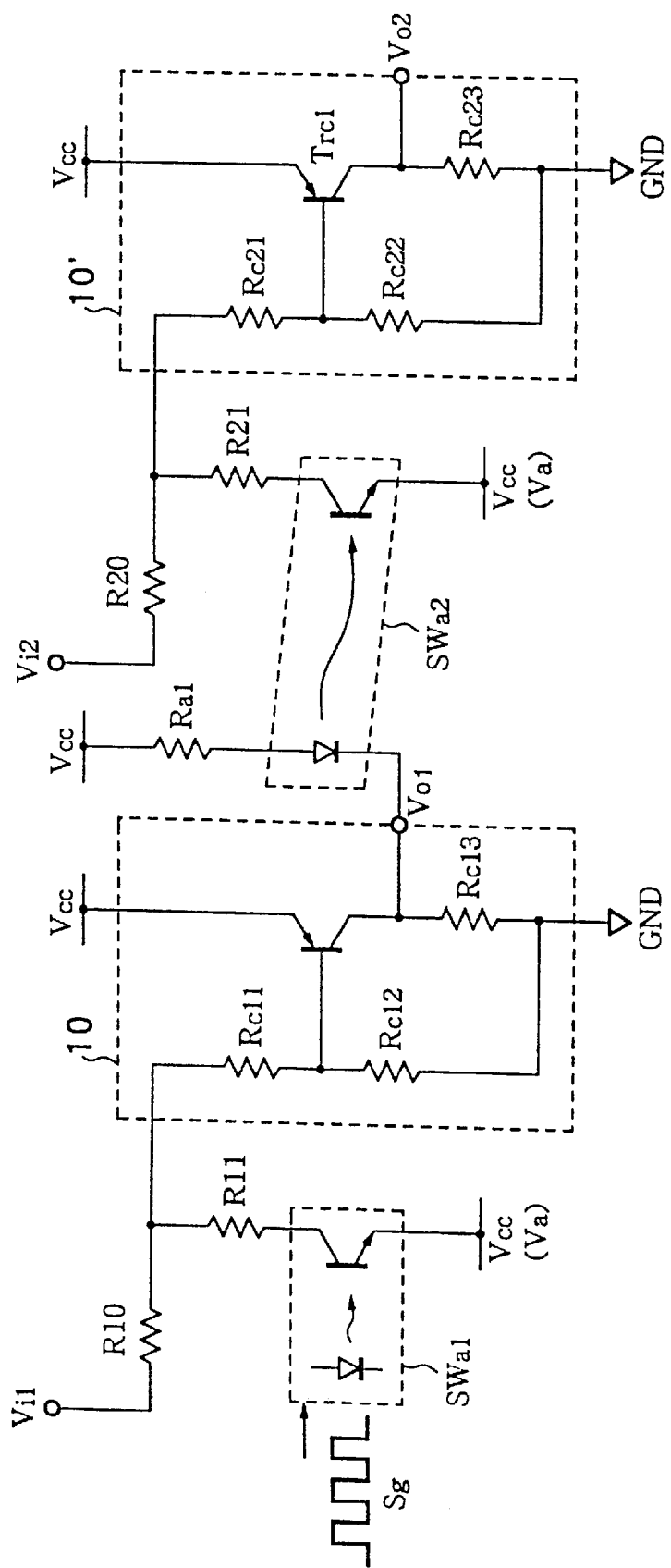
FIG. 23 is a diagram showing a specific circuit example of FIG. 22.

FIG. 23 is a specific circuit example of a construction where the photocoupler of FIG. 5(A) is used as the first and second respective switches SWa1 and SWa2, and the comparator of FIG. 6(B) is used as level detection circuits 10 and 10' in the AND gate circuit of FIG. 22. In this case, the construction is such that a light emitting diode of the next stage switch SWa2 is connected via a resistor Ra1 to the output Vo1 of the first threshold value operation circuit, and by driving the light emitting diode with the output Vo1, a phototransistor of the switch SWa2 is switched.

Here since the operation of the respective threshold value operation circuits is the same as described beforehand, description will be omitted.

Figure 24:
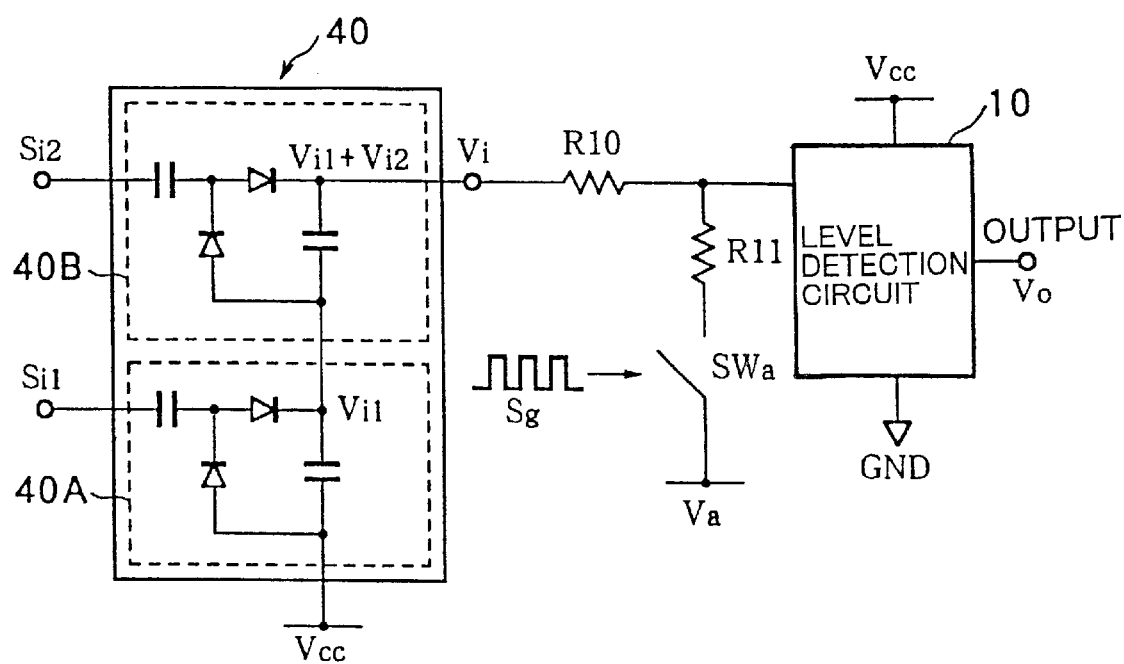
FIG. 24 is a structural diagram of an AND gate circuit for the case where an input signal is an AC signal.

FIG. 24 shows a structural example of an AND gate circuit for the case where the input signals are both AC signals, illustrating a structural example of where the threshold value operation circuit of FIG. 3 is used. Needless to say, this can also be similarly constructed from the other threshold value operation circuits.

In FIG. 24, the AND gate circuit of this embodiment provides an adder circuit 40 comprising first and second voltage doubler rectifying circuits 40A and 40B, each comprising two capacitors and two diodes, for respectively voltage doubler rectifying AC input signals Si1 and Si2. The adder circuit 40 adds the rectified output Vi1 from the first voltage doubler rectifying circuit 40A which rectifies the AC signal Si1, to the rectified output Vi2 from the second voltage doubler rectifying circuit 40B which rectifies the AC signal Si2, and generates an addition output of Vi1+Vi2. The construction is such that this addition output (Vi1+Vi2) is input to the threshold value operation circuit as the input signal Vi, and subjected to a threshold value operation by the threshold value operation circuit.

Hereunder is a description of the operation.

The addition output level Vi of the adder circuit 40, with the logic value 1 amplitudes (peak—peak) of the AC input signals Si1 and Si2 respectively as Vi1, Vi2, becomes Vi=Vi1+Vi2+Vcc. If the lower limit threshold value VtL is set in the range Vi1+Vcc, Vi2+Vcc<VtL<Vi1+Vi2+Vcc, then only when the AC input signals Si1, Si2 are both input at a level of logic value 1 is an AC signal (logic value 1) output.

Figure 25:
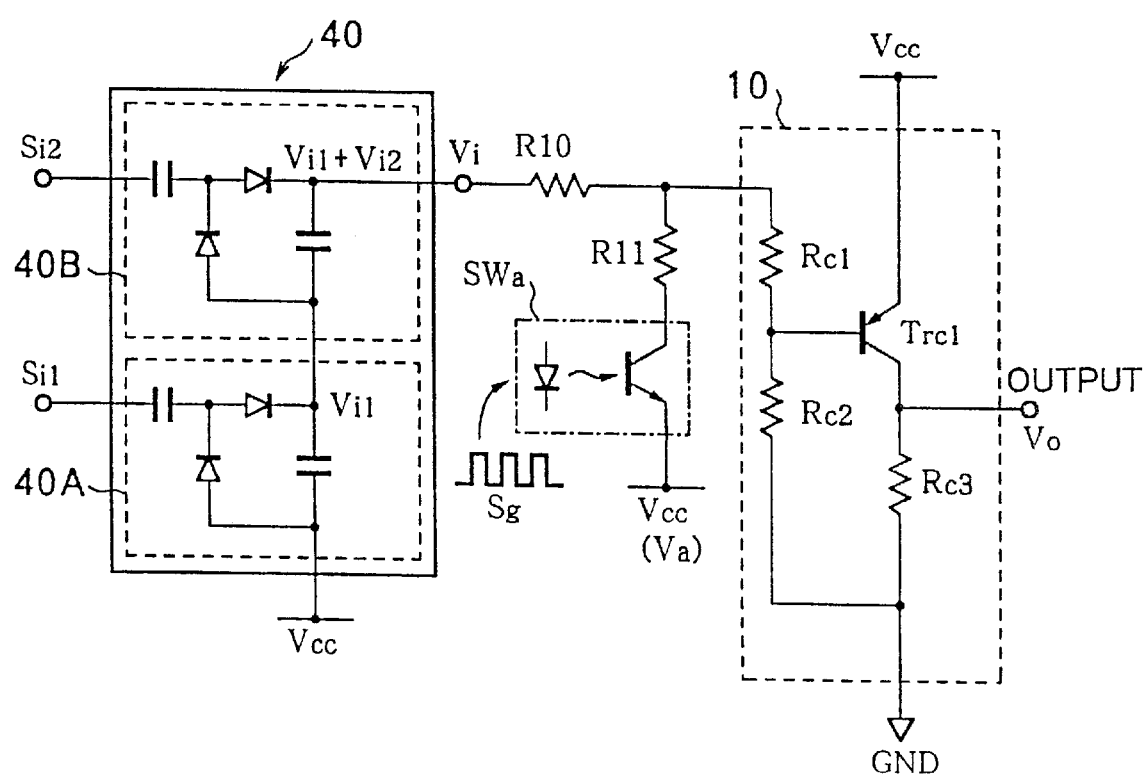
FIG. 25 is a diagram showing a specific circuit example of FIG. 24.

FIG. 25 shows a specific circuit structural example for where in the AND gate circuit of FIG. 24, the photocoupler of FIG. 5(A) is used in the switch SWa of the threshold value operation circuit, and the comparator of FIG. 6(B) is used in the level detection circuit 10. Since the operation of the threshold value operation circuit is the same as mentioned before, description is omitted.

In the case where, as with the circuit shown as an example in FIG. 25, a threshold value operation circuit having upper and lower limit threshold values is used, if the lower limit threshold value VtL and upper limit threshold value VtH are set for example as Vcc<VtL<Vi1+Vcc, Vi2+Vcc<VtH<Vi1+Vi2+Vcc, then it is also possible for an AC output to be generated from the threshold value operation circuit only when either one of the AC input signals Si1 or Si2 is input (logic value 1).

In FIG. 24 an AND gate circuit construction for the case of two inputs is shown. To have an n input AND gate circuit, an adder circuit can be constructed from n voltage doubler rectifying circuits, and the lower limit threshold value of the threshold value operation circuit set between a rectified addition level for when n AC input signals are all at a logic value 1level, and a rectified addition level for when one of the n AC input signals is at a logic value 0 level.

Figure 26:
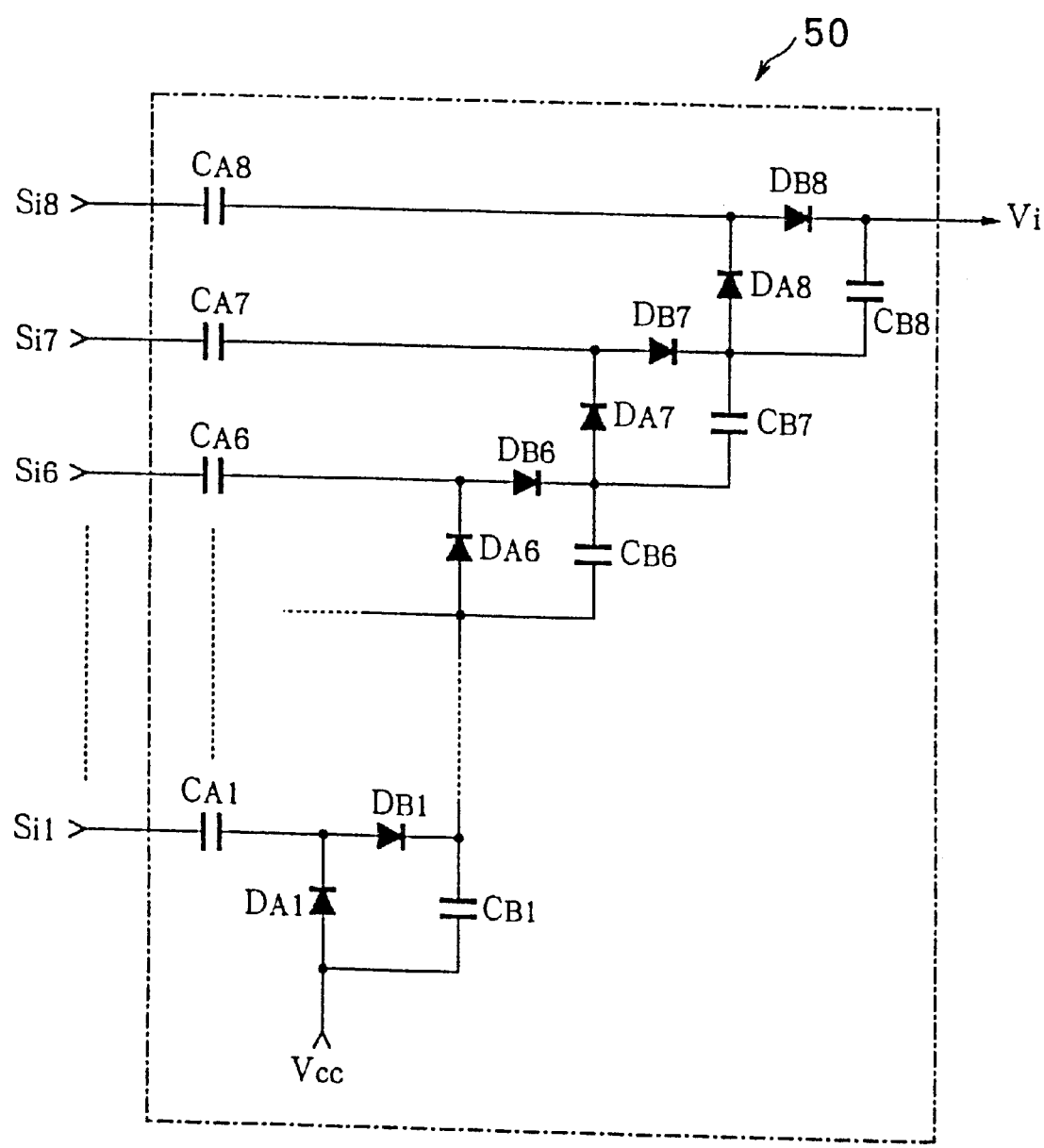
FIG. 26 is a structural diagram of an adder circuit in a multiple input AND gate circuit.

FIG. 26 shows a structural example of an adder circuit 50 for when n=8.

In FIG. 26, the addition output Vi (ΣVin (n=1~8)) from the adder circuit 50 is input to a threshold value operation circuit of the present invention as the input signal. In this case, if the rectified output from one rectifying circuit is ViJ, the lower limit threshold value ViL of the threshold value operation circuit is set to the range 7Vij+Vcc<ViL<8 Vij+Vcc. In this way, only when all of the input AC signals Si1~Si8 are at a level of logic value 1 is an AC signal generated from the threshold value operation circuit.

The construction of the adder circuit by such rectifying circuits is known for example from International Patent Publication WO93/23772 or from "Application of Fail-safe Multi-Valued Logic to Optical Sensor Scanning Circuit", (National Meeting of the Japanese Institute of Electrical Engineers, 699, 1993).

Next is a description of a self hold circuit which uses the threshold value operation circuit of the present invention.

Figure 27:
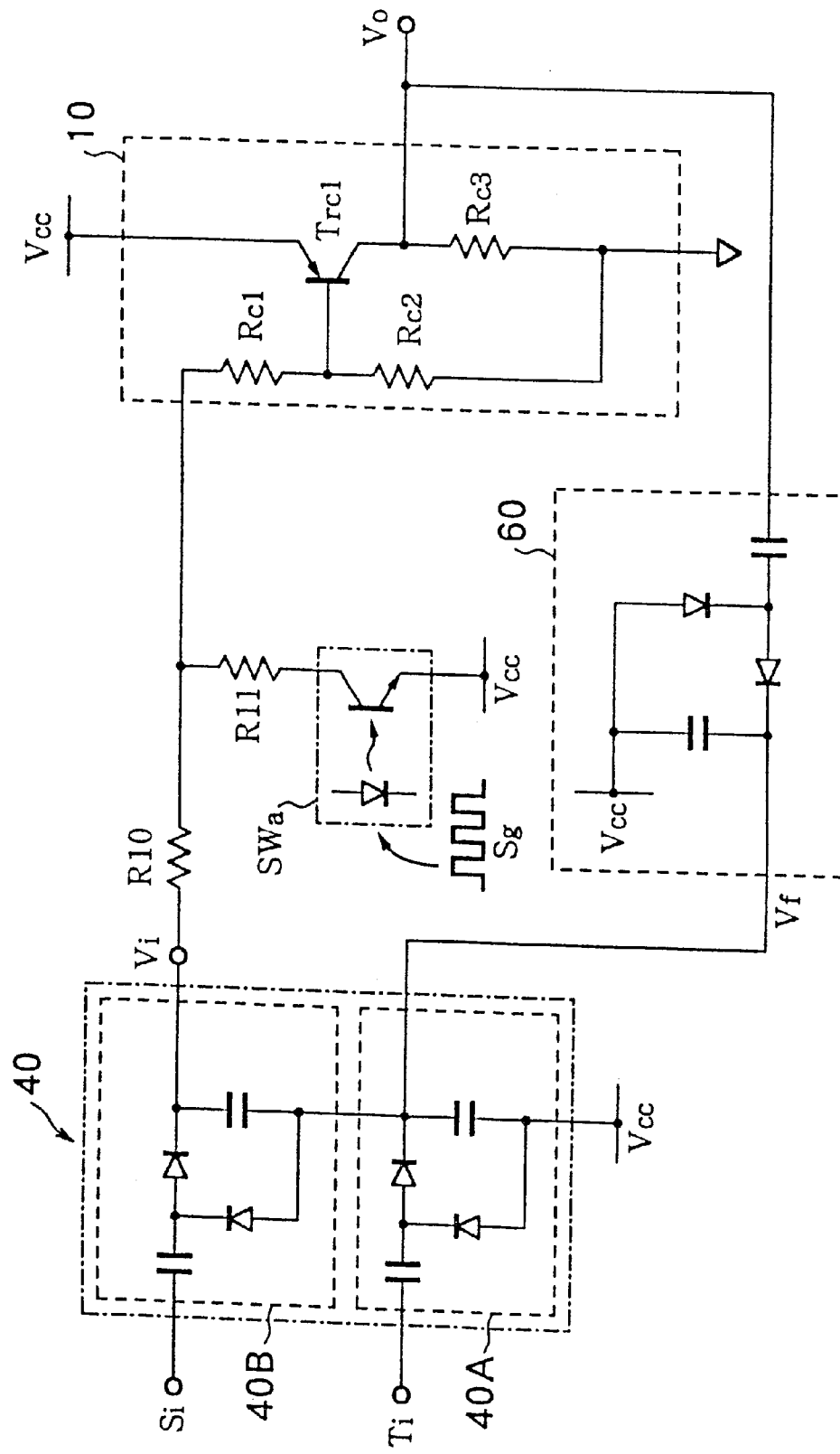
FIG. 27 is a structural diagram of an embodiment of a self hold circuit of the present invention.

FIG. 27 shows a specific circuit structural example of a self hold circuit of the invention.

In FIG. 27, with the self hold circuit of this embodiment, the construction is such that the output Vo from the AND gate circuit shown in FIG. 25 is rectified by a voltage doubler rectifying circuit 60, and the resultant rectified output Vf is fed back to an output terminal of a first voltage doubler rectifying circuit 40A of an adder circuit 40. An input terminal of a second voltage doubler rectifying circuit 40B is made a reset input terminal (or hold input terminal) and an input terminal of the first voltage doubler rectifying circuit 40A is made a trigger input terminal. Components the same as for the embodiment of FIG. 25 are denoted by the same reference symbols. The voltage doubler rectifying circuit 60 is constructed the same as the first and second voltage doubler rectifying circuits 40A and 40B.

Figure 28:
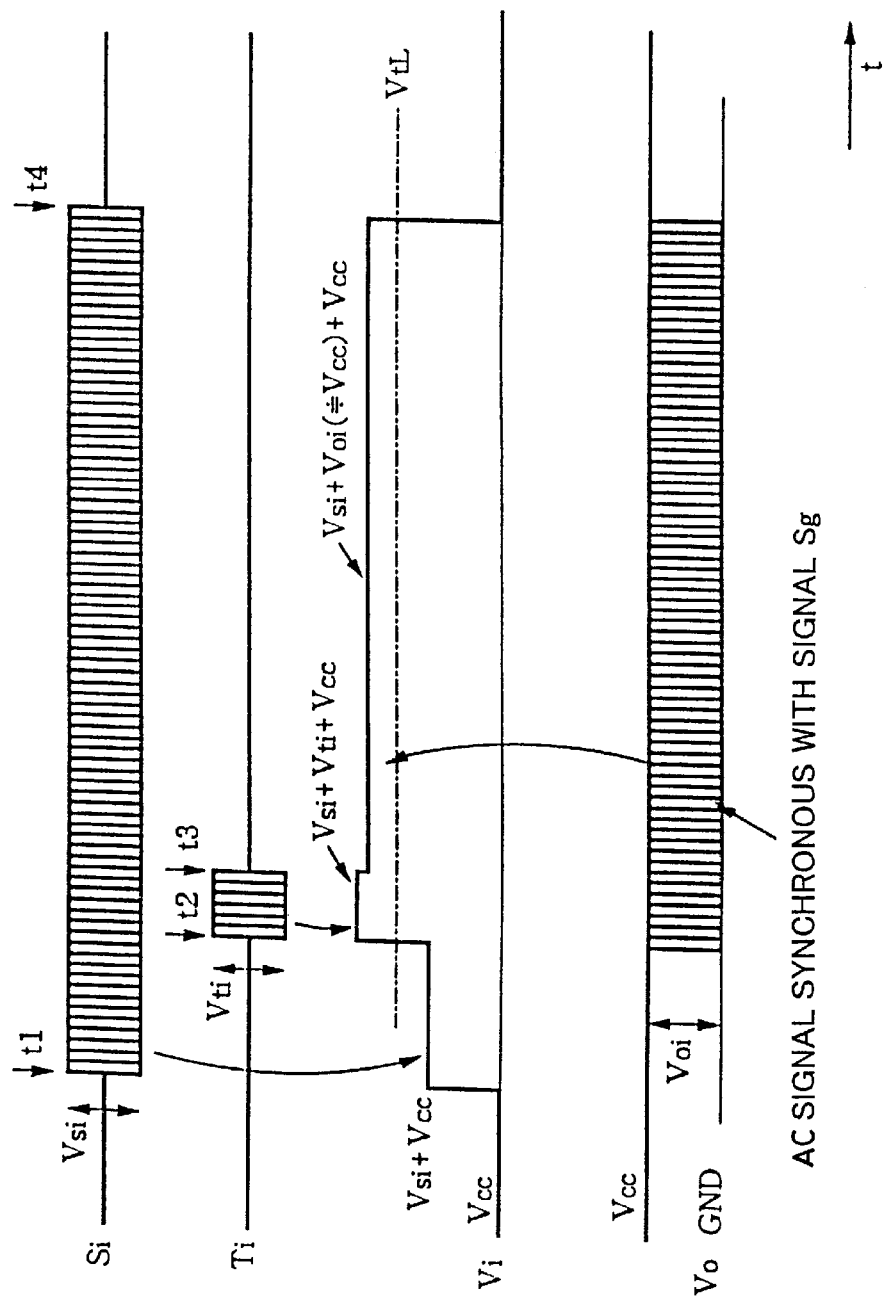
FIG. 28 is an operational time chart for the circuit of FIG. 27.

Next is a description of the operation based on the time chart shown in FIG. 28.

Here, at a logic value 1, the input signal Si is an AC signal with an amplitude (peak—peak) Vsi, and the input signal Ti is an AC signal with an amplitude (peak—peak) Vti, while at logic value 0, both become DC signals.

When an AC input signal Si is not input to the reset input terminal (at the time of logic value 0), the input Vi being the rectified addition output is approximately Vcc. When at the time t1, the AC input signal Si is input (logic value 1), the input Vi to the threshold value operation circuit becomes approximately Vsi+Vcc. Here if the lower limit threshold value VtL of the threshold value operation circuit is set to Vsi+Vcc, Vti+Vcc<VtL<Vsi+Vti+Vcc, Vsi+Voi+Vcc, then in the time from t1~t2, the output Vo from the threshold value operation circuit is a DC signal (logic value 0). When at time t2, an AC input signal Ti is input to the trigger input terminal (logic value 1), the input Vi become Vsi+Vti+Vcc, and exceeds the lower limit threshold value VtL. Therefore the output Vo from the threshold value operation circuit becomes logic value 1, and an AC signal (amplitude Voi (peak—peak)≒Vcc) is generated. This AC signal is input to the voltage doubler rectifying circuit 60 and rectified, and a rectified output Vf=Voi+Vcc is produced, and fed back by an OR connection to the output terminal of the first voltage doubler rectifying circuit 40A of the adder circuit 40. At time t3, even if the AC signal Ti of the trigger input terminal disappears, since the rectified signal Vf of the output Vo is being fed back, the input Vi is maintained at the condition Vsi+Voi+Vcc>VtL, so that the output Vo=1 (AC signal) continues. When at time t4 the AC input signal Si disappears, the input Vi becomes Voi+Vcc<VtL, so that the output Vo becomes a DC signal (logic value 0).

The threshold value operation circuit applied to the self hold circuit of FIG. 27 is not limited to this construction, and needless to say may be the other threshold value operation circuits of the present invention.

Figure 29:
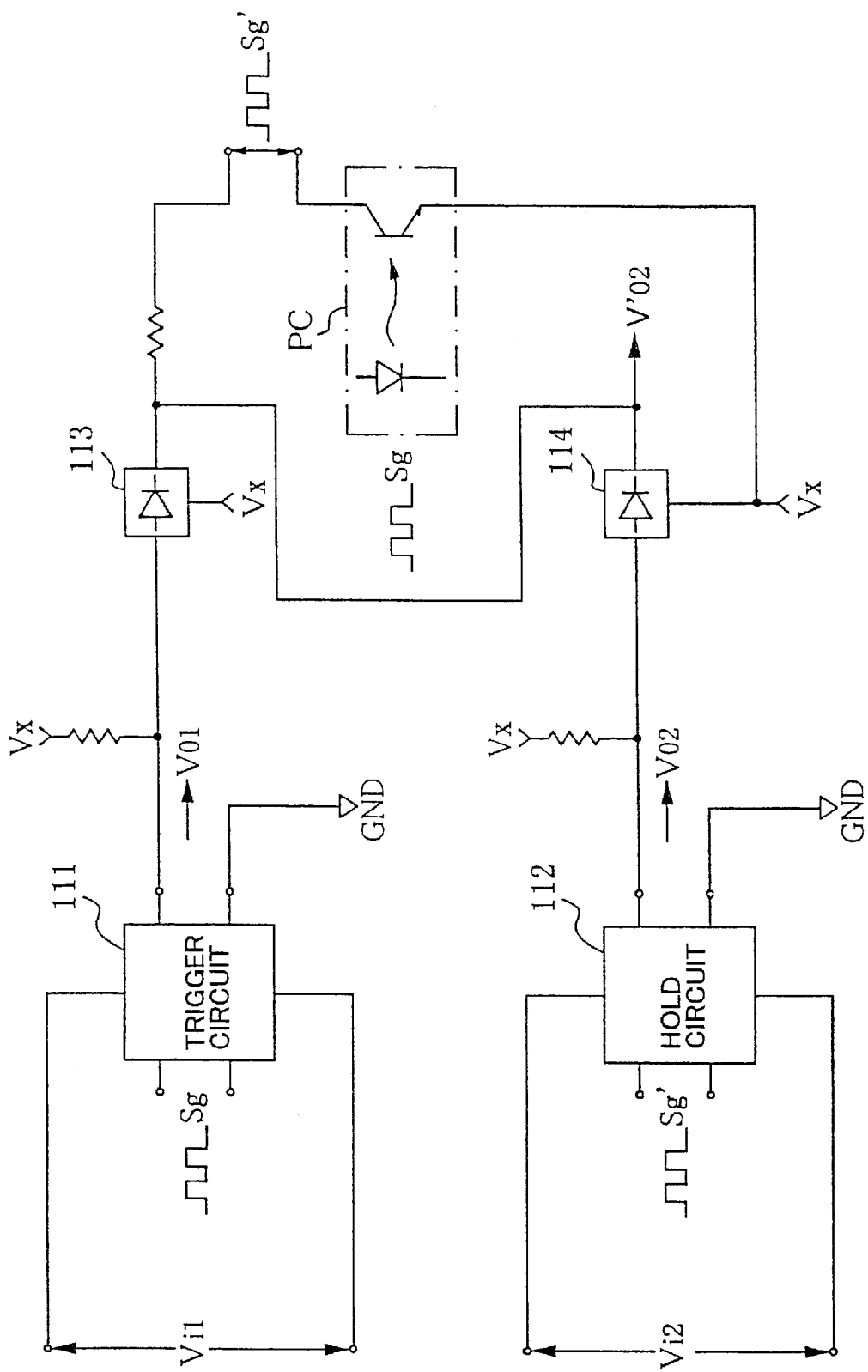
FIG. 29 is a structural diagram of another embodiment of a self hold circuit.

FIG. 29 shows another structural example of a self hold circuit to which the threshold value operation circuit of FIG. 11 is applied.

In FIG. 29, a trigger circuit 111 and a hold circuit 112 both have the same construction as the threshold value operation circuit of FIG. 11. The trigger circuit 111 modulates the input signal Vi1 by means of an AC switching signal Sg from outside, to perform threshold value operation. The hold circuit 112 modulates the input signal Vi2 with an AC signal generated as a result of the threshold value operation of the trigger circuit 111 as a switching signal Sg', to thereby perform threshold value operation. The output from the hold circuit 112 supplies the current for generating the switching signal Sg'. Numerals 113 and 114 in the figure denote the before mentioned voltage doubler rectifying circuits, and PC denotes a photocoupler which switches the rectified output from the voltage doubler rectifying circuit 113 in synchronous with the external AC switching signal Sg, to generate the switching signal Sg'.

With the operation of this self hold circuit, when the input signal Vi1 satisfies a set level, the trigger circuit 111 generates an output signal Vo1. This output signal Vo1 is rectified by the voltage doubler rectifying circuit 113, and a switching signal Sg' is generated via the photocoupler PC by the switching signal Sg. The input signal Vi2 of the hold circuit 112 is modulated by this switching signal Sg', and when the input signal Vi2 satisfies the set level, an output signal Vo2 is generated from the hold circuit 112. This output signal Vo2 is rectified by the voltage doubler rectifying circuit 114 and output to the outside as an output signal V'o2, and is also supplied to the output side of the voltage doubler rectifying circuit 113 to supply a current for generating the switching signal Sg'. Consequently, after the switching signal Sg' is generated with generation of the input signal Vi1, and the output signal Vo2 is generated with the input of the input signal Vi2, then even if the input signal Vi1 being the trigger input disappears, then provided that the input signal Vi2 being the hold input does not disappear, the generation of the output signal Vo2 continues. After this, when the input signal Vi2 disappears, the output signal Vo2 disappears, so that the switching signal Sg' stops, and as long as the input signal Vi1 being the trigger input is not again input, the switching signal Sg' is not generated, and output signal Vo2 is not generated.

Figure 30:
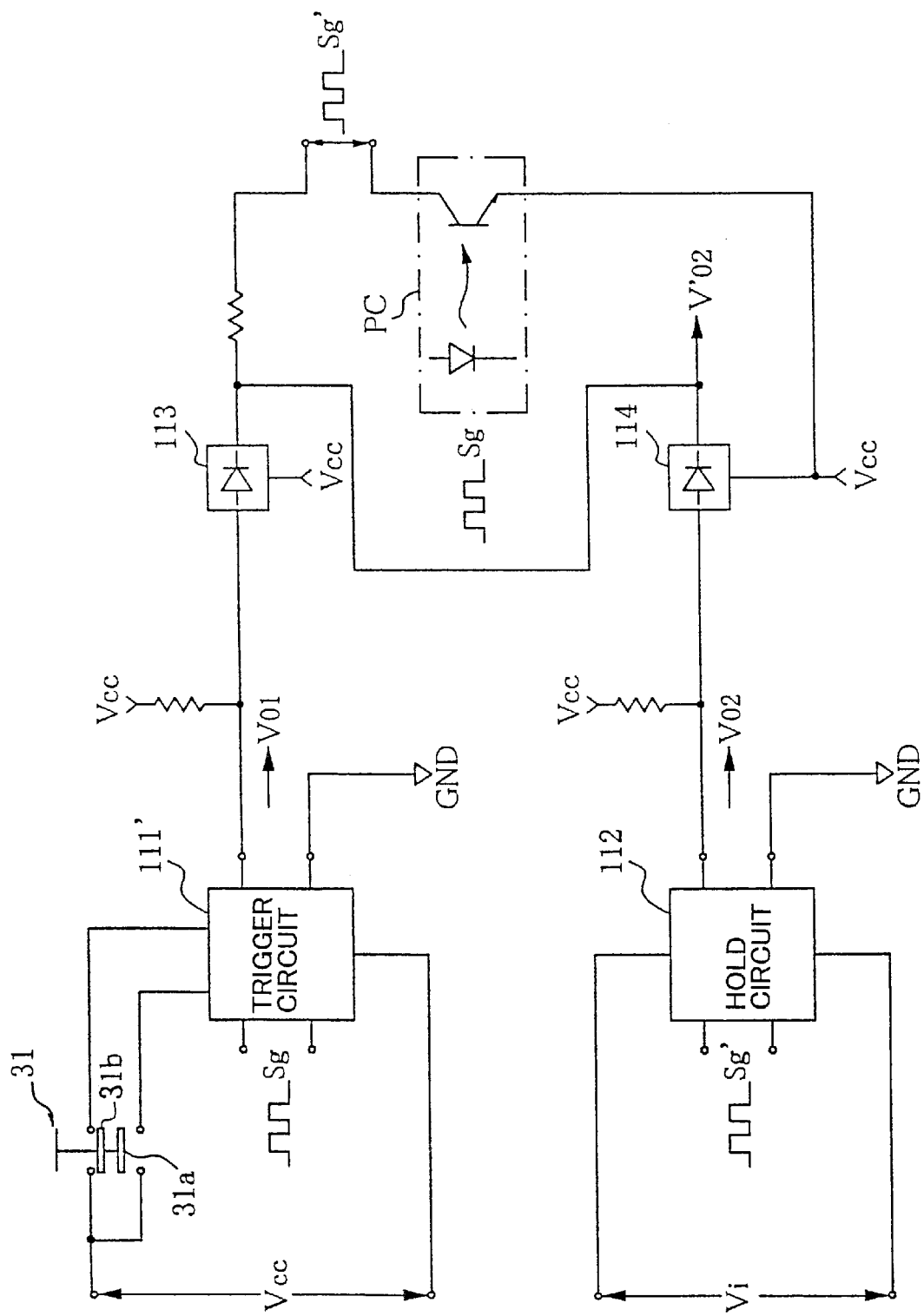
FIG. 30 is a structural diagram of a start signal generating circuit to which the self hold circuit of FIG. 29 is applied.
Figure 31:
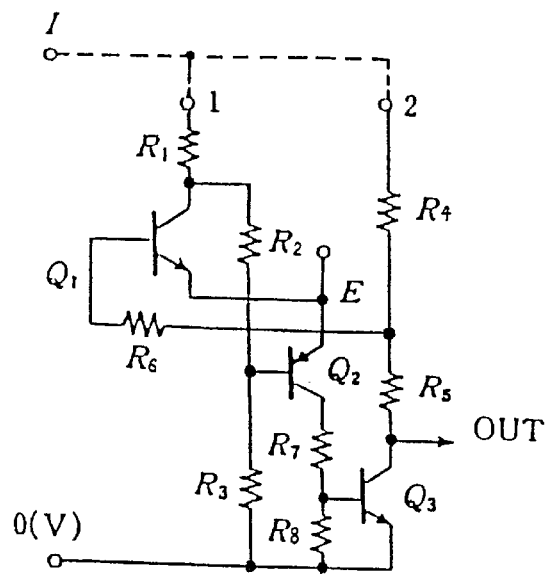
FIG. 31 is a diagram showing a conventional threshold value operation circuit example.
Figure 31:
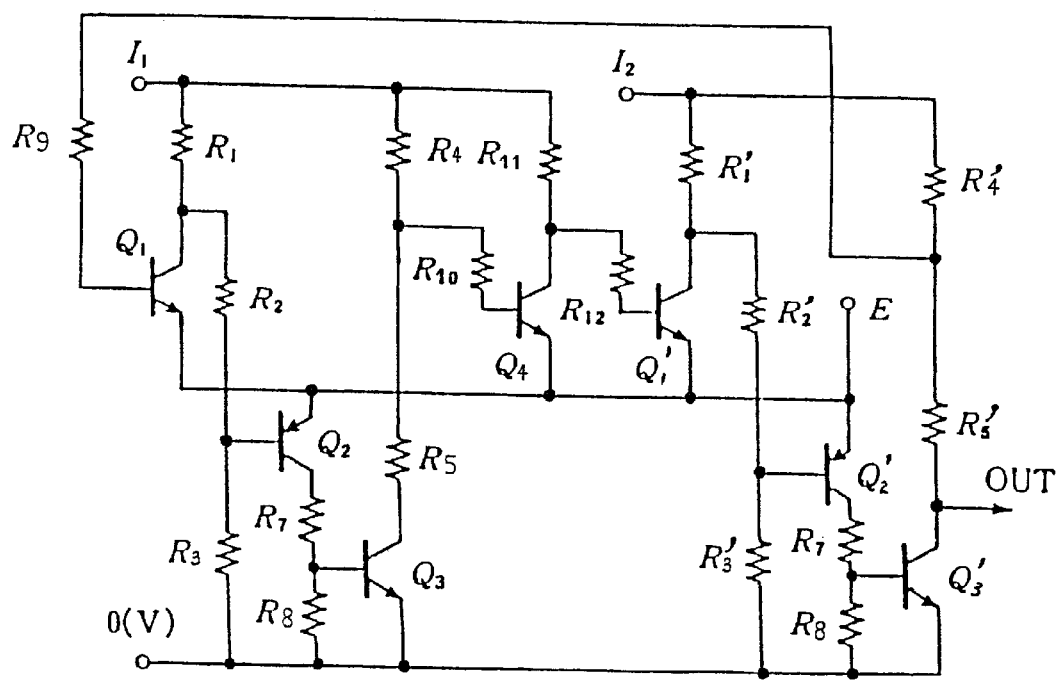
Figure 32:
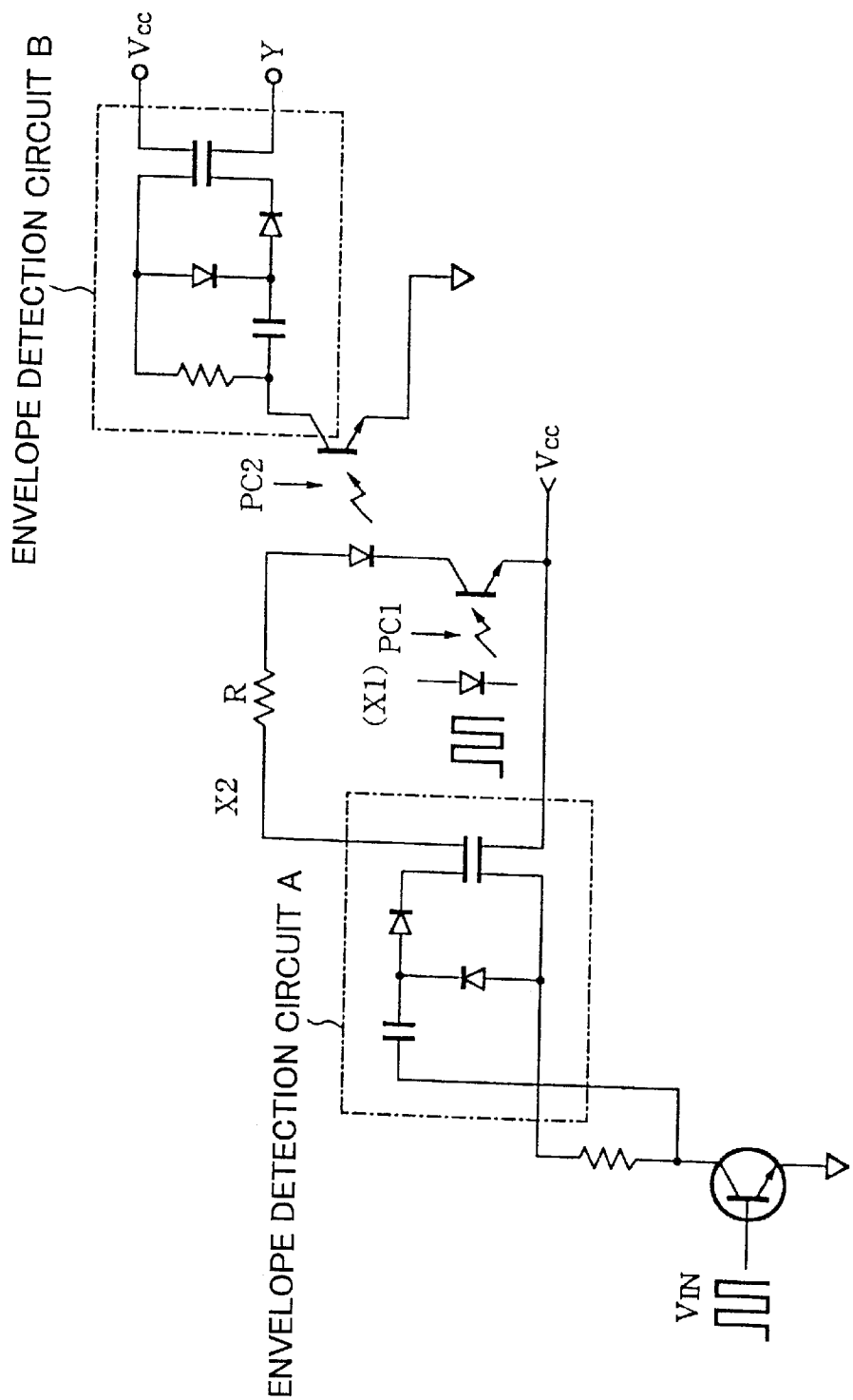
FIG. 32 is a diagram showing another example of a conventional threshold value operation circuit.

FIG. 30 shows a structural example for the case where the self hold circuit of FIG. 29 is applied to the start signal generating circuit of FIG. 20.

In FIG. 30, a trigger circuit 111' in the start signal generating circuit corresponds to a part in FIG. 20 where the start switch 31 is removed.

With such a construction, when the start switch 31 is switched off (first contact point 31a is off, second contact point 31b is on) after being on (first contact point 31a is on), then with the power source voltage Vcc normal, an output signal Vo1 is generated from the trigger circuit 111', and a switching signal Sg' is generated. Then, if the input signal Vi of the hold circuit 112 is a set level, an output signal Vo2 is generated from the hold circuit 112, and when an output signal V'o2 is generated from the voltage doubler rectifying circuit 114, the switching signal Sg' is self held by this output signal Vo2'.

INDUSTRIAL APPLICABILITY

With the present invention, analogue type threshold value operation is possible with respect to the input signal, and an AC signal having stabilized frequency and duty ratio can be generated. Therefore, the invention can be used for fail-safe power sources and like, and hence industrial applicability is great.

What is claimed is:

1. A threshold value operation circuit comprising:
   modulation means for modulating an input signal by means of a switching signal from an AC (alternating current) source; and
   level detection means for level detecting the modulated input signal by comparing the modulated input signal with a previously set threshold value, and generating an AC signal when, based on a level detection result of said level detection means, a level of said modulated input signal is a set level.

2. A threshold value operation circuit according to claim 1, wherein said level detection means includes an AC signal generating means which includes a photocoupler.

3. A threshold value operation circuit according to claim 1, wherein said modulation means switches a switch means by said switching signal from said AC source, to modulate said input signal.

4. A threshold value operation circuit according to claim 3, wherein with said modulation means, said switch means is disposed between a signal line between an input side and an output side, and a constant voltage supply line.

5. A threshold value operation circuit according to claim 4, wherein said modulation means incorporates a first resistor disposed in said signal line between the input side and a contact point of said switch means, and a second resistor disposed between the switch contact point of said signal line and said switch means.

6. A threshold value operation circuit according to claim 3, wherein said modulation means incorporates a first resistor and said switch means disposed in series in a signal line between an input side and an output side, and a second resistor with one end connected to the signal line between said switch means and output side, and the other end connected to a constant voltage supply line.

7. A threshold value operation circuit according to claim 3, wherein said modulation means incorporates a first resistor and said switch means disposed in series in a signal line between an input side and an output side, and a second resistor connected in parallel with a series circuit of said first resistor and switch means.

8. A threshold value operation circuit according to claim 3, wherein said switch means is a photocoupler which is switched by input of the switching signal from said AC source.

9. A threshold value operation circuit according to claim 3, wherein said switch means is a transistor which is switched by input of the switching signal from said AC source.

10. A threshold value operation circuit according to claim 9, wherein the switching signal input to said transistor has an amplitude of a range between said input signal subject to threshold value operation and the voltage of a constant voltage supply line.

11. A threshold value operation circuit according to claim 9, wherein the switching signal input to said transistor is a signal which does not cross over a threshold value of said level detection means.

12. A threshold value operation circuit according to claim 1, wherein said modulation means incorporates a buffer circuit which takes the input of said AC source switching signal, and supplies this to an input line to which said input signal is applied.

13. A threshold value operation circuit according to claim 12, wherein said buffer circuit supplies a signal with an amplitude proportional to said input signal to said input line.

14. A threshold value operation circuit according to claim 1, wherein said level detection means is a comparator.

15. A threshold value operation circuit according to claim 14, wherein an AC output from said comparator is transmitted to an output circuit side via a photocoupler.

16. A threshold value operation circuit according to claim 1, wherein said level detection means incorporates a Zenner diode and a photocoupler for generating the AC signal which is switched by an output from said Zenner diode.

17. A threshold value operation circuit according to claim 1, wherein said level detection means level detects with only the current supplied by said input signal.

18. A threshold value operation circuit according to claim 17, wherein said level detection means is a Zenner diode.

19. A threshold value operation circuit comprising:
  a first Zenner diode for level detecting an input signal subject to threshold value operation;
  a switch means which is switched by a switching signal from an AC source, for modulating an output signal from said first Zenner diode;
  a first photocoupler which is switched by input of a modulation signal modulated by said switch means, for modulating said input signal subject to threshold value operation;
  a second Zenner diode for level detecting a modulation signal of said input signal subject to threshold value operation which has been modulated by the switching operation of said first photocoupler, and
  a second photocoupler which is switched by an output signal from said second Zenner diode, for generating an AC signal,
  wherein when the level of said input signal subject to threshold value operation is a set level, the AC signal is generated from said second photocoupler.

20. An AND gate circuit comprising a plurality of threshold value operation circuits connected in cascade each of which comprises:
  modulation means for modulating an input signal by means of a switching signal from an AC (alternating current) source; and
  level detection means for level detecting the modulated input signal by comparing the modulated input signal with a previously set threshold value, and generating an AC signal when, based on a level detection result of said level detection means, a level of said modulated input signal is a set level, wherein
  the AC output from a former stage threshold value operation circuit is input as the switching signal to the modulation means of a latter stage threshold value operation circuit, instead of the AC source.

21. An AND gate circuit comprising:
  a threshold value operation circuit which comprises:
    modulation means for modulating an input signal by means of a switching signal from an AC (alternating current) source; and
    level detection means for level detecting the modulated input signal by comparing the modulated input signal with a previously set threshold value, and generating an AC signal when based on a level detection result of said level detection means, a level of said modulated input signal is a set level; and
  an adder circuit comprising a plurality of rectifying circuits for respectively rectifying AC input signals, which sequentially adds a rectified output from a first stage rectifying circuit to a rectified output from a next stage rectifying circuit, and outputs the added values for all of the AC input signals from a final stage rectifying circuit,
  wherein the addition output from said adder circuit is supplied as the input signal subject to threshold value operation of said threshold value operation circuit.

22. A self hold circuit comprising two threshold value operation circuits each of which comprises:
  modulation means for modulating an input signal by means of a switching signal from an AC (alternating current) source; and level detection means for level detecting the modulated input signal by comparing the modulated input signal with a previously set threshold value, and generating an AC signal when based on a level detection result of said level detection means, a level of said modulated input signal subject to threshold value operation is a set level, wherein one threshold value operation circuit is made a trigger circuit and the other threshold value operation circuit is made a hold circuit, and an AC signal which is generated based on a logical sum operation on an output from said trigger circuit and an output from said hold circuit is input to a modulation means of said hold circuit as the switching signal instead of the AC source.

23. A self hold circuit comprising:

a threshold value operation circuit which comprises:
  modulation means for modulating an input signal by means of a switching signal from an AC (alternating current) source; and
  level detection means for level detecting the modulated input signal by comparing the modulated input signal with a previously set threshold value, and generating an AC signal when based on a level detection result of said level detection means, a level of said modulated input signal subject to threshold value operation is a set level; and an adder circuit comprising two rectifying circuits for respectively rectifying AC input signals, which adds a rectified output from a former stage rectifying circuit to a rectified output from a latter stage rectifying circuit, and outputs the added values of the two AC input signals from the latter stage rectifying circuit, wherein the addition output from said adder circuit is supplied to an input terminal of said threshold value operation circuit as the input signal subject to threshold value operation, and an input terminal of the latter stage rectifying circuit of said adder circuit is made a hold input terminal, and an input terminal of the former stage rectifying circuit is made a trigger input terminal, and the AC output signal from said threshold value operation circuit is rectified and then fed back to an output terminal of said former stage rectifying circuit.

24. A start signal generating circuit comprising:

a start switch comprising a first contact point and a second contact point having a complimentary relation to each other for on/off switching;

a capacitor which is charged via the first contact point which comes on when said start switch is pressed, and which is discharged via the second contact point which comes on when said start switch returns, for generating an output signal; and a threshold value operation circuit which comprises:
  modulation means for modulating an input signal by means of a switching signal from an AC (alternating current) source; and
  level detection means for level detecting the modulated input signal by comparing the modulated input signal with a previously set threshold value, and generating an AC signal when based on a level detection result of said level detection means, a level of said modulated input signal subject to threshold value operation is a set level;

wherein the output signal from said capacitor is made the input signal subject to threshold value operation of said threshold value operation circuit, and the output from the threshold value operation circuit is made a start signal for a machine.

25. A start signal generating circuit comprising a first and a second threshold value operation circuits each of which comprises:
  modulation means for modulating an input signal by means of a switching signal from an AC (alternating current) source; and
  level detection means for level detecting the modulated input signal by comparing the modulated input signal with a previously set threshold value, and generating an AC signal when based on a level detection result of said level detection means, a level of said modulated input signal subject to threshold value operation is a set level, wherein an AC output from the first threshold value operation circuit is input to the modulation means of the second threshold value operation circuit as the switching signal instead of the AC source, and wherein a power source voltage level is subject to a threshold value operation by the first threshold value operation circuit, and an output signal which is generated based on an ON operation of an operation button is made the input signal subject to threshold value operation of the second threshold value operation circuit, and the output from said second threshold value operation circuit is made the start signal for a machine.

26. A start signal generating circuit comprising a self hold circuit provided with two threshold value operation circuits each of which comprises:
  modulation means for modulating an input signal by means of a switching signal from an AC (alternating current) source; and
  level detection means for level detecting the modulated input signal by comparing the modulated input signal with a previously set threshold value, and generating an AC signal when based on a level detection result of said level detection means, a level of said modulated input signal subject to threshold value operation is a set level, wherein one threshold value operation circuit is made a trigger circuit and the other threshold value operation circuit is made a hold circuit, and an AC signal which is generated based on a logical sum operation on an output from said trigger circuit and an output from said hold circuit is input to a modulation means of said hold circuit as the switching signal instead of an AC source, and wherein an output signal generated in accordance with the on/off operation of a start switch comprising first and second contact points having a complimentary relation to each other for on/off switching, is input to said trigger circuit of said self hold circuit as the input signal subject to threshold value operation, and only when the input signal subject to threshold value operation is a set level, and the input signal level to the hold circuit is a set level, is a start signal generated from the self hold circuit.

27. A threshold value operation circuit comprising:

level detector which level detects an input signal by comparing the input signal with a previously set threshold value;

modulator which modulates the level detected signal by a switching signal from an AC (alternating current) source; and AC signal generator which generates an AC signal, said AC signal generator being switched by input of a modulation signal modulated by said modulation means, wherein said AC signal is generated when, based on a level detection result of said level detector, a level of said input signal is a set level.

* * * * *